US012796059B2

(12) United States Patent
Kubouchi et al.

(10) Patent No.: US 12,796,059 B2
(45) Date of Patent: Nov. 10, 2026

(54) SEMICONDUCTOR DEVICE AND METHOD FOR MANUFACTURING SEMICONDUCTOR DEVICE

(71) Applicant: FUJI ELECTRIC CO., LTD., Kanagawa (JP)

(72) Inventors: Motoyoshi Kubouchi, Matsumoto-city (JP); Makoto Shimosawa, Matsumoto-city (JP); Takashi Yoshimura, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 307 days.

(21) Appl. No.: 18/749,503

(22) Filed: Jun. 20, 2024

(65) Prior Publication Data

US 2024/0339517 A1 Oct. 10, 2024

Related U.S. Application Data

(63) Continuation of application No. PCT/JP2023/025207, filed on Jul. 6, 2023.

(30) Foreign Application Priority Data

Jul. 11, 2022 (JP) ................................ 2022-111094

(51) Int. Cl.
*H01L 29/45* (2006.01)
*H01L 21/285* (2006.01)
(Continued)

(52) U.S. Cl.
CPC ............ *H10D 64/62* (2025.01); *H10D 8/422* (2025.01); *H10D 12/481* (2025.01);
(Continued)

(58) Field of Classification Search
CPC .. H10D 64/62; H10D 64/231; H10D 64/0112; H10D 12/481; H10D 84/617; H10D 62/53; H10D 8/422
See application file for complete search history.

(56) References Cited

U.S. PATENT DOCUMENTS 6,177,338 B1 * 1/2001 Liaw .................. H10P 14/6336 257/E21.252
2002/0142616 A1 10/2002 Giewont
(Continued)

FOREIGN PATENT DOCUMENTS

DE 102015113184 A1 2/2017
JP H0697111 A 4/1994
(Continued)

OTHER PUBLICATIONS

Office Action issued for counterpart German Application 112023000330.0, issued by the German Patent and Trademark Office on Oct. 30, 2025 (received on Oct. 31, 2025).
(Continued)

*Primary Examiner* — Peniel M Gumedzoe

(57) ABSTRACT

Provided is a semiconductor device comprising: a semiconductor substrate; an interlayer dielectric film that has a contact hole and is provided above the semiconductor substrate; a first alloy layer provided on an upper surface of the semiconductor substrate below the contact hole; an oxide layer provided on an upper surface of the first alloy layer in the contact hole; a barrier metal layer that is conductive and provided above the oxide layer in the contact hole; and a plug layer provided above the barrier metal layer in the contact hole.

20 Claims, 26 Drawing Sheets

(51) Int. Cl.

| | |
|---|---|
| ***H01L 27/06*** | (2006.01) |
| ***H01L 29/32*** | (2006.01) |
| ***H01L 29/417*** | (2006.01) |
| ***H01L 29/739*** | (2006.01) |
| ***H01L 29/861*** | (2006.01) |
| ***H10D 8/00*** | (2025.01) |
| ***H10D 12/00*** | (2025.01) |
| ***H10D 62/53*** | (2025.01) |
| ***H10D 64/01*** | (2025.01) |
| ***H10D 64/23*** | (2025.01) |
| ***H10D 64/62*** | (2025.01) |
| ***H10D 84/60*** | (2025.01) |

(52) U.S. Cl.

CPC ......... *H10D 62/53* (2025.01); *H10D 64/0112* (2026.01); *H10D 64/231* (2025.01); *H10D 84/617* (2025.01)

(56) References Cited

U.S. PATENT DOCUMENTS

| | | | | |
|---|---|---|---|---|
| 2004/0021174 | A1 | 2/2004 | Kobayashi | |
| 2008/0124915 | A1 | 5/2008 | Yamaguchi | |
| 2009/0280641 | A1* | 11/2009 | Kang | H10B 63/10 438/653 |
| 2015/0235956 | A1* | 8/2015 | Lin | H10D 64/0112 257/757 |
| 2017/0032972 | A1 | 2/2017 | Tsai | |
| 2017/0141030 | A1 | 5/2017 | Bergendahl | |
| 2020/0020579 | A1 | 1/2020 | Kato | |
| 2022/0013645 | A1 | 1/2022 | Shimosawa | |
| 2022/0278094 | A1 | 9/2022 | Yokoyama | |
| 2024/0339517 | A1 | 10/2024 | Kubouchi | |

FOREIGN PATENT DOCUMENTS

| | | | |
|---|---|---|---|
| JP | 2002334850 | A | 11/2002 |
| JP | 2003318396 | A | 11/2003 |
| JP | 2007335554 | A | 12/2007 |
| JP | 2020013828 | A | 1/2020 |
| JP | 2022016842 | A | 1/2022 |
| WO | 2021251011 | A1 | 12/2021 |
| WO | 2024014401 | A1 | 1/2024 |

OTHER PUBLICATIONS

International Search Report and Written Opinion (ISA/237) of the International Search Authority for International Patent Application No. PCT/JP2023/025207, mailed by the Japan Patent Office on Sep. 26, 2023.

* cited by examiner

SEMICONDUCTOR DEVICE AND METHOD FOR MANUFACTURING SEMICONDUCTOR DEVICE

The contents of the following patent application(s) are incorporated herein by reference:

NO. 2022-111094 filed in JP on Jul. 11, 2022

NO. PCT/JP2023/025207 filed in WO on Jul. 6, 2023

BACKGROUND

1. Technical Field

The present invention relates to a semiconductor device and a method for manufacturing the semiconductor device.

2. Related Art

Patent document 1 describes a semiconductor device provided with a silicide layer in a contact hole.

PRIOR ART DOCUMENT

Patent Document

Patent Document 1: Japanese Laid-Open Patent Publication No. 2003-318396

Patent Document 2: Japanese Laid-Open Patent Publication No. 2007-335554

Patent Document 3: Japanese Laid-Open Patent Publication No. 2002-334850

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are imperative to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X-axis, a Y-axis, and a Z axis. The orthogonal coordinate axes merely specify relative positions of components, and do not limit a specific direction. For example, the Z axis is not limited to indicate the height direction with respect to the ground. Note that a +Z-axis direction and a −Z-axis direction are directions opposite to each other. When the Z-axis direction is described without describing the signs, it means that the direction is parallel to the +Z axis and the −Z axis.

In the present specification, orthogonal axes parallel to the upper surface and the lower surface of the semiconductor substrate are referred to as the X-axis and the Y-axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X-axis direction and a Y-axis direction.

In the present specification, a description of a P+ type or an N+ type means a higher doping concentration than that of the P-type or the N-type, and a description of a P-type or an N-type means a lower doping concentration than that of the P-type or the N-type.

Figure 1A:
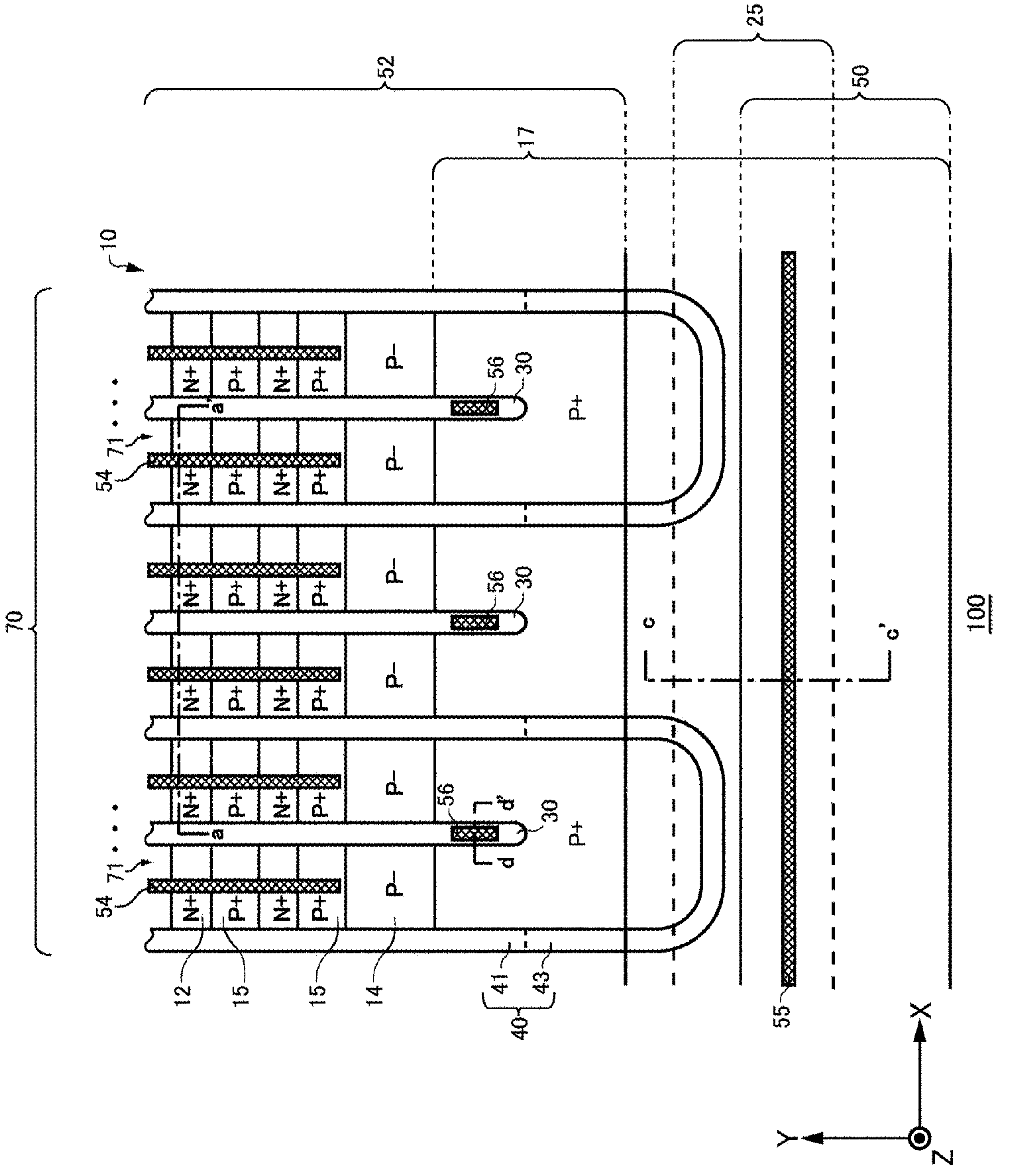
FIG. 1A illustrates an example of a top view of a semiconductor device 100.

FIG. 1A illustrates an example of a top view of the semiconductor device 100. The semiconductor device 100 in the present example is a semiconductor chip including a transistor portion 70. The semiconductor device 100 is not limited to a transistor as long as it is a semiconductor element in which a semiconductor substrate 10 has a MOS gate structure.

The transistor portion 70 is a region obtained by projecting a collector region 22 provided on a back surface side of a semiconductor substrate 10 onto an upper surface of the semiconductor substrate 10. The collector region 22 will be described below. The transistor portion 70 includes a transistor such as an IGBT. In the present example, the transistor portion 70 is the IGBT. It should be noted that the transistor portion 70 may be another transistor such as a MOSFET.

The present figure illustrates a region around an active portion of the semiconductor device 100 and other regions are omitted. For example, an edge termination structure portion may be provided in a region on a negative side in the Y-axis direction in the semiconductor device 100 in the present example. The edge termination structure portion reduces electric field strength on an upper surface side of the semiconductor substrate 10. The edge termination structure portion has, for example, a guard ring, a field plate, a RESURF, and a structure combining these. It should be noted that although the present example describes an edge on the negative side in the Y-axis direction for convenience, the same applies to other edges of the semiconductor device 100.

The semiconductor substrate 10 is a substrate that is formed of a semiconductor material. The semiconductor substrate 10 may be a silicon substrate, may be a silicon carbide substrate, may be a gallium nitride substrate, may be a diamond substrate, or may be other kinds of substrate. The semiconductor substrate 10 in the present example is the silicon substrate. It should be noted that, when simply referred to as a top view in the present specification, it means that the semiconductor substrate 10 is viewed from an upper surface side. As will be described later, the semiconductor substrate 10 includes a front surface 21 and a back surface 23.

The semiconductor device 100 in the present example includes, at a front surface 21 of the semiconductor substrate 10, a gate trench portion 40, a dummy trench portion 30, an emitter region 12, a base region 14, a contact region 15, and a well region 17. In addition, the semiconductor device 100 in the present example includes an emitter electrode 52 and a gate metal layer 50 which are provided above the front surface 21 of the semiconductor substrate 10. The emitter electrode 52 and the gate metal layer 50 are an example of a front-surface-side metal layer 53 to be described later. The gate trench portion 40 is an example of the MOS gate structure provided in the semiconductor device 100. It is to be noted that although the semiconductor device 100 of the present example is a transistor including the MOS gate structure, the semiconductor device 100 may alternatively be a diode including the MOS gate structure.

The emitter electrode 52 is provided above the gate trench portion 40, the dummy trench portion 30, the emitter region 12, the base region 14, the contact region 15, and the well region 17. In addition, the gate metal layer 50 is provided above the connection portion 25 and the well region 17.

The emitter electrode 52 and the gate metal layer 50 are formed of a material containing metal. At least a partial region of the emitter electrode 52 may be formed of metal such as aluminum (Al) or of a metal alloy such as an aluminum-silicon alloy (AlSi) or an aluminum-silicon-copper alloy (AlSiCu). At least a partial region of the gate metal layer 50 may be formed of metal such as aluminum (Al) or of a metal alloy such as an aluminum-silicon alloy (AlSi) or an aluminum-silicon-copper alloy (AlSiCu). The emitter electrode 52 and the gate metal layer 50 may include a barrier metal layer formed of titanium, a titanium compound, or the like under the region formed of aluminum and the like. The barrier metal layer will be described below. The emitter electrode 52 and the gate metal layer 50 are provided separately from each other.

The emitter electrode 52 and the gate metal layer 50 are provided with an interlayer dielectric film 38 sandwiched therebetween, above the semiconductor substrate 10. The interlayer dielectric film 38 is omitted in FIG. 1A. A contact hole 54, a contact hole 55, and a contact hole 56 are provided through the interlayer dielectric film 38.

The contact hole 55 electrically connects the gate metal layer 50 and the gate conductive portion in the transistor portion 70 through the connection portion 25. A plug layer formed of tungsten or the like may be formed inside the contact hole 55. The plug layer will be described later.

The contact hole 56 connects the emitter electrode 52 with a dummy conductive portion inside the dummy trench portion 30. A plug layer formed of tungsten or the like may be formed inside the contact hole 56.

A connection portion 25 is connected to a front-surface-side metal layer 53 such as the emitter electrode 52 or the gate metal layer 50. In an example, the connection portion 25 is provided between the gate metal layer 50 and the gate conductive portion. The connection portion 25 of the present example may be provided extending in the X-axis direction and electrically connected to the gate conductive portion. The connection portion 25 may also be provided between the emitter electrode 52 and the dummy conductive portion. In the present example, the connection portion 25 is not provided between the emitter electrode 52 and the dummy conductive portion. The connection portion 25 is formed of a conductive material such as polysilicon doped with an impurity. The connection portion 25 in the present example is polysilicon doped with an impurity of the N-type (N+). The connection portion 25 is provided above the front surface 21 of the semiconductor substrate 10 via a dielectric film such as an oxide film, or the like.

Gate trench portions 40 are examples of a plurality of trench portions extending in a predetermined extending direction on a front surface 21 side of the semiconductor substrate 10. The gate trench portions 40 are arrayed at a predetermined interval along a predetermined array direction (the X-axis direction in the present example). The gate trench portion 40 in the present example may have two extending parts 41 which extend along an extending direction (the Y-axis direction in the present example) parallel to the front surface 21 of the semiconductor substrate 10 and perpendicular to the array direction, and a connecting part 43 which connects the two extending parts 41.

At least part of the connecting part 43 is preferably formed in a curved shape. Connecting end portions of the two extending parts 41 of the gate trench portion 40 can reduce electric field strength at the end portions of the extending parts 41. The gate metal layer 50 may be electrically connected to the gate conductive portion through the connection portion 25 in the connecting part 43 of the gate trench portion 40.

Dummy trench portions 30 are examples of a plurality of trench portions extending in a predetermined extending direction on the front surface 21 side of the semiconductor substrate 10. The dummy trench portion 30 is a trench portion which is electrically connected to the emitter electrode 52. Similarly to the gate trench portions 40, the dummy trench portions 30 are arrayed at a predetermined interval along a predetermined array direction (the X-axis direction in the present example). The dummy trench portion 30 in the present example has an I shape at the front surface 21 of the semiconductor substrate 10, but may have a U shape at the front surface 21 of the semiconductor substrate 10 similarly to the gate trench portion 40. That is, the dummy trench portion 30 may have two extending parts which extend along the extending direction and a connecting part which connects the two extending parts.

The transistor portion 70 in the present example has a structure in which two gate trench portions 40 and two dummy trench portions 30 are repetitively arrayed. That is, the transistor portion 70 in the present example has the gate trench portions 40 and the dummy trench portions 30 at a ratio of 1:1. For example, the transistor portion 70 has one dummy trench portion 30 between two extending parts 41.

It is to be noted that the ratio between the gate trench portions 40 and the dummy trench portions 30 is not limited to that in the present example. The ratio of the gate trench portions 40 may be larger than the ratio of the dummy trench portions 30, or the ratio of the dummy trench portions 30 may be larger than the ratio of the gate trench portions 40. The ratio between the gate trench portions 40 and the dummy trench portions 30 may be 2:3, or may be 2:4. In addition, the transistor portion 70 may not have the dummy trench portions 30 with all trench portions being the gate trench portions 40.

The well region 17 is a region of a second conductivity type which is provided on the front surface 21 side of the semiconductor substrate 10 relative to a drift region 18 which will be described below. The well region 17 is an example of the well region provided in a peripheral side of the active portion 120. The active portion 120 will be described below. The well region 17 is of the P+ type as an example. The well region 17 is formed in a predetermined range from an end portion of an active region on a side where the gate metal layer 50 is provided. A diffusion depth of the well region 17 may be deeper than depths of the gate trench portion 40 and the dummy trench portion 30. Partial regions of the gate trench portion 40 and the dummy trench portion 30 on a gate metal layer 50 side are formed in the well region 17. Bottoms of ends in the extending direction of the gate trench portion 40 and the dummy trench portion 30 may be covered with the well region 17.

The contact hole 54 is formed above each of the emitter region 12 and the contact region 15 in the transistor portion 70. The contact hole 54 is not provided above well regions 17 provided at both ends in the Y-axis direction. In this manner, the interlayer dielectric film includes one or more contact holes 54 formed therein. One or more contact holes 54 may be provided to extend in the extending direction.

A mesa portion 71 is a mesa portion provided in direct contact with the trench portion in a plane parallel to the front surface 21 of the semiconductor substrate 10. The mesa portion may be a part of the semiconductor substrate 10 sandwiched between two adjacent trench portions, and may be a part from the front surface 21 of the semiconductor substrate 10 to a depth of the lowermost bottom portion of each trench portion. An extending part of each trench portion may be defined as one trench portion. That is, the region sandwiched between two extending parts may be defined as a mesa portion.

The mesa portion 71 is provided in direct contact with at least one of the dummy trench portion 30 or the gate trench portion 40 in the transistor portion 70. The mesa portion 71 has the well region 17, the emitter region 12, the base region 14, and the contact region 15 at the front surface 21 of the semiconductor substrate 10. In the mesa portion 71, emitter regions 12 and contact regions 15 are alternately provided in the extending direction.

The base region 14 is a region of the second conductivity type which is provided on the front surface 21 side of the semiconductor substrate 10. The base region 14 is of the P-type as an example. The base regions 14 may be provided at both end portions of the mesa portion 71 in the Y-axis direction at the front surface 21 of the semiconductor substrate 10. It should be noted that FIG. 1A shows only one end portion in the Y-axis direction of the base region 14.

The emitter region 12 is a region of a first conductivity type having a higher doping concentration than the drift region 18. The emitter region 12 in the present example is of the N+ type as an example. Examples of a dopant of the emitter region 12 include arsenic (As). The emitter region 12 is provided in contact with the gate trench portion 40 at the front surface 21 in the mesa portion 71. The emitter region 12 may be provided to extend in the X-axis direction from one to another of two trench portions sandwiching the mesa portion 71. The emitter region 12 is also provided below the contact hole 54.

In addition, the emitter region 12 may be or may not be in contact with the dummy trench portion 30. The emitter region 12 in the present example is in contact with the dummy trench portion 30.

The contact region 15 is a region of the second conductivity type provided above the base region 14 and having a higher doping concentration than the base region 14. The contact region 15 in the present example is of the P+ type as an example. The contact region 15 in the present example is provided at the front surface 21 in the mesa portion 71. The contact region 15 may be provided in the X-axis direction from one to another of the two trench portions sandwiching the mesa portion 71. The contact region 15 may be or may not be in contact with the gate trench portion 40 or the dummy trench portion 30. The contact region 15 in the present example is in contact with the dummy trench portion 30 and the gate trench portion 40. The contact region 15 is also provided below the contact hole 54.

Figure 1B:
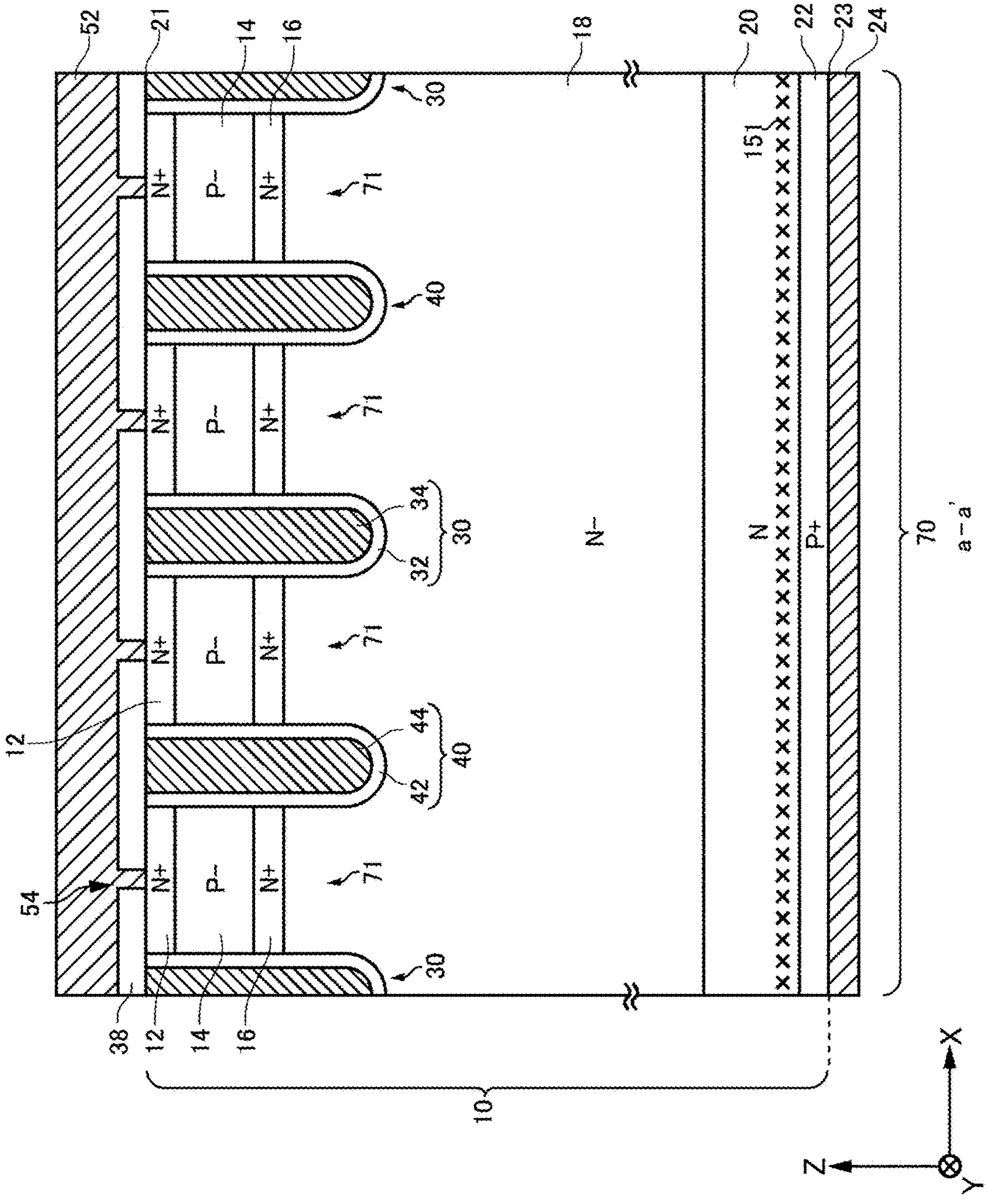
FIG. 1B illustrates an example of a cross section a-a' in FIG. 1A.

FIG. 1B illustrates an example of the cross section a-a' in FIG. 1A. The cross section a-a' is an X-Z plane which passes through the emitter region 12 in the transistor portion 70. The semiconductor device 100 in the present example has the semiconductor substrate 10, the interlayer dielectric film 38, the emitter electrode 52, and a collector electrode 24 in the cross section a-a'. The collector electrode 24 is an example of a back-surface-side metal layer provided in contact with the back surface 23 of the semiconductor substrate 10. The emitter electrode 52 is formed above the semiconductor substrate 10 and the interlayer dielectric film 38.

The drift region 18 is a region of the first conductivity type which is provided in the semiconductor substrate 10. The drift region 18 in the present example is of the N-type as an example. The drift region 18 may be a region which has remained without other doped regions formed in the semiconductor substrate 10. That is, a doping concentration in the drift region 18 may be a doping concentration in the semiconductor substrate 10.

A buffer region 20 is a region of the first conductivity type which is provided on a back surface 23 side of the semiconductor substrate 10 relative to the drift region 18. The buffer region 20 in the present example is of the N-type as an example. The doping concentration of the buffer region 20 is higher than the doping concentration of the drift region 18. The buffer region 20 may function as a field stop layer which prevents a depletion layer expanding from a lower surface side of the base region 14 from reaching the collector region 22 of the second conductivity type. It should be noted that the buffer region 20 may be omitted.

The collector region 22 is provided below the buffer region 20 in the transistor portion 70. The collector region 22 has the second conductivity type. The collector region 22 in the present example is of the P+ type as an example.

The collector electrode 24 is formed at the back surface 23 of the semiconductor substrate 10. The collector electrode 24 is formed of a conductive material such as metal. A material of the collector electrode 24 may be the same as or different from the material of the emitter electrode 52.

The base region 14 is a region of the second conductivity type which is provided above the drift region 18. The base region 14 is provided in contact with the gate trench portion 40. The base region 14 may be provided in contact with the dummy trench portion 30.

The emitter region 12 is provided above the base region 14. The emitter region 12 is provided between the base region 14 and the front surface 21. The emitter region 12 is provided in contact with the gate trench portion 40. The emitter region 12 may be or may not be in contact with the dummy trench portion 30.

An accumulation region 16 is a region of the first conductivity type which is provided on the front surface 21 side of the semiconductor substrate 10 relative to the drift region 18. The accumulation region 16 in the present example is of the N+ type as an example. It is to be noted that the accumulation region 16 may not be provided.

The accumulation region 16 is provided in contact with the gate trench portion 40. The accumulation region 16 may be or may not be in contact with the dummy trench portion 30. A doping concentration in the accumulation region 16 is higher than the doping concentration in the drift region 18. An ion implantation dose amount in the accumulation region 16 may be 1.0 E+12 $cm^{-2}$ or more and 1.0 E+13 $cm^{-2}$ or less. In addition, the ion implantation dose amount in the accumulation region 16 may be 3.0 E+12 $cm^{-2}$ or more and 6.0 E+12 $cm^{-2}$ or less. Providing the accumulation region 16 can increase a carrier injection enhancement effect (IE effect) to reduce an on-voltage of the transistor portion 70.

One or more gate trench portions 40 and one or more dummy trench portions 30 are provided at the front surface 21. Each trench portion is provided from the front surface 21 to the drift region 18. In a region provided with at least any of the emitter region 12, the base region 14, the contact region 15, or the accumulation region 16, each trench portion also passes through these regions to reach the drift region 18. The configuration of the trench portion passing through the doped region is not limited to the one manufactured in the order of forming the doped region and then forming the trench portion. The configuration of the trench portion passing through the doped region includes a configuration of the doped region being formed between the trench portions after forming the trench portion.

The gate trench portion 40 has a gate trench, a gate dielectric film 42, and a gate conductive portion 44 which are formed at the front surface 21. The gate dielectric film 42 is formed to cover an inner wall of the gate trench. The gate dielectric film 42 may be formed by oxidizing or nitriding a semiconductor on the inner wall of the gate trench. The gate conductive portion 44 is formed farther inward than the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered with the interlayer dielectric film 38 on the front surface 21.

The gate conductive portion 44 includes a region opposing the adjacent base region 14 on the side of the mesa portion 71 by sandwiching the gate dielectric film 42 in a depth direction of the semiconductor substrate 10. When a predetermined voltage is applied to the gate conductive portion 44, a channel is formed by an electron inversion layer in a surface layer of the base region 14 at a boundary in contact with the gate trench.

The dummy trench portion 30 may have the same structure as that of the gate trench portion 40. The dummy trench portion 30 has a dummy trench, a dummy dielectric film 32, and a dummy conductive portion 34 which are formed on the front surface 21 side. The dummy dielectric film 32 is formed covering the inner walls of the dummy trench. The dummy conductive portion 34 is formed inside the dummy trench, and is formed farther inward than the dummy dielectric film 32. The dummy dielectric film 32 insulates the dummy conductive portion 34 from the semiconductor substrate 10. The dummy trench portion 30 may be covered with the interlayer dielectric film 38 on the front surface 21.

The interlayer dielectric film 38 is provided above the semiconductor substrate 10. The interlayer dielectric film 38 in the present example is provided in contact with the front surface 21. The emitter electrode 52 is provided above the interlayer dielectric film 38. The interlayer dielectric film 38 is provided with one or more contact holes 54 to electrically connect the emitter electrode 52 and the semiconductor substrate 10. Similarly, the contact hole 55 and the contact hole 56 may be provided to pass through the interlayer dielectric film 38. A film thickness of the interlayer dielectric film 38 is, for example, 1.0 μm, but is not limited to this.

The interlayer dielectric film 38 may be a silicon oxide film. The interlayer dielectric film 38 may be a BPSG (Boro-phospho Silicate Glass) film, may be a BSG (borosilicate glass) film, or may be a PSG (Phosphosilicate glass) film. The interlayer dielectric film 38 may also include a high temperature silicon oxide (HTO: High Temperature Oxide) film.

The back surface side lifetime control region 151 may be provided in the transistor portion 70. It is to be noted that the back surface side lifetime control region 151 may be omitted. The back surface side lifetime control region 151 is a region where a lifetime killer has intentionally been formed by implanting an impurity inside the semiconductor substrate 10, or the like. As an example, the back surface side lifetime control region 151 is formed by implanting helium into the semiconductor substrate 10. The back surface side lifetime control region 151 may also be formed by implanting protons. By providing the back surface side lifetime control region 151, a turn-off time can be reduced, and by suppressing a tail current, losses during switching can be reduced.

The lifetime killer is a recombination center of carriers. The lifetime killer may be a lattice defect. For example, the lifetime killer may be a vacancy, a divacancy, a defect complex of these with elements constituting the semiconductor substrate 10, or dislocation. In addition, the lifetime killer may be a noble gas element such as helium or neon, a metal element such as platinum, or the like. An electron beam or a proton may be used for forming the lattice defect.

A lifetime killer concentration is a concentration at the recombination center of carriers. The lifetime killer concentration may be a concentration of the lattice defect. For example, the lifetime killer concentration may be a vacancy concentration of a vacancy, a divacancy, or the like, may be a concentration of a defect complex of these vacancies with elements constituting the semiconductor substrate 10, or may be a dislocation concentration. In addition, the lifetime killer concentration may be a chemical concentration of a noble gas element such as helium or neon, or may be a chemical concentration of a metal element such as platinum.

The back surface side lifetime control region 151 is provided on the back surface 23 side relative to the center of the semiconductor substrate 10 in the depth direction of the semiconductor substrate 10. The back surface side lifetime control region 151 of the present example is provided in the buffer region 20. The back surface side lifetime control region 151 of the present example is provided on an entire surface of the semiconductor substrate 10 in the X-Y plane, and can be formed without using a mask. The back surface side lifetime control region 151 may be provided in a part of the semiconductor substrate 10 in the X-Y plane. An impurity dose amount for forming the back surface side lifetime control region 151 may be 0.5 E+10 $cm^{-2}$ or more and 1.0 E+14 $cm^{-2}$ or less, or may be 5.0 E+10 $cm^{-2}$ or more and 1.0 E+13 $cm^{-2}$ or less.

The back surface side lifetime control region 151 may be formed by an implantation from the back surface 23 side. Accordingly, it becomes easy to avoid an influence on the front surface 21 side of the semiconductor device 100. For example, the back surface side lifetime control region 151 is formed by irradiating it with helium or proton from the back surface 23 side. Herein, which of the front surface 21 side and the back surface 23 side the implantation is performed from for forming the back surface side lifetime control region 151 can be determined by acquiring a state of the front surface 21 side by an SRP method or a measurement of a leakage current.

Figure 2A:
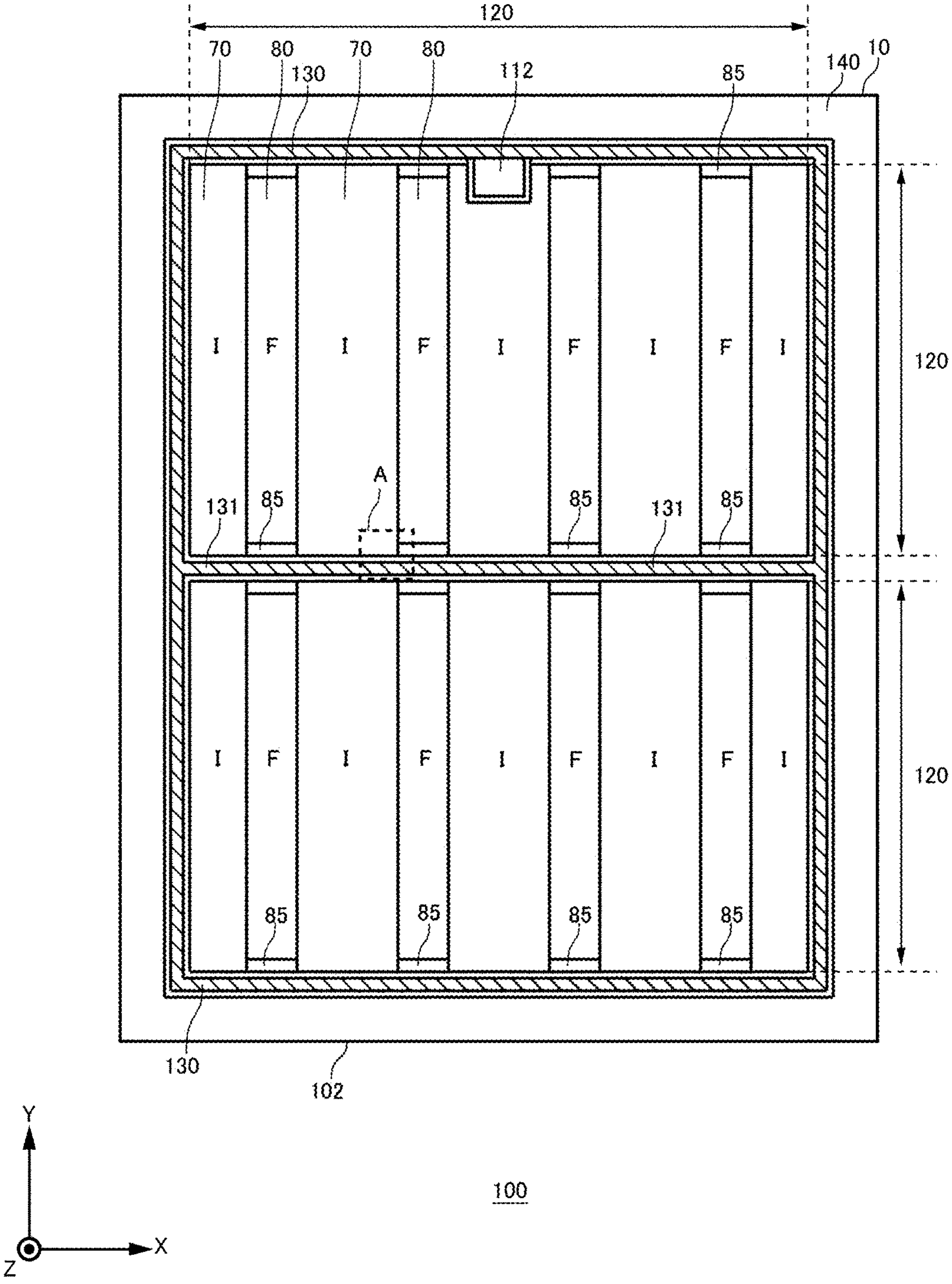
FIG. 2A illustrates a top view of a modification example of the semiconductor device 100.

FIG. 2A illustrates a top view of the modification example of the semiconductor device 100. The present example illustrates merely some members of the semiconductor device 100, and omits some members.

The semiconductor substrate 10 has an end side 102 in a top view. The semiconductor substrate 10 of the present example includes two sets of end sides 102 facing each other in the top view. In the present example, the X-axis and the Y-axis are parallel to any of the end sides 102.

The semiconductor substrate 10 is provided with an active portion 120. The active portion 120 is a region where a main current flows in the depth direction between the front surface 21 and a back surface 23 of the semiconductor substrate 10 when the semiconductor device 100 operates. An emitter electrode 52 is provided above the active portion 120, but is omitted in the present figure.

The active portion 120 is provided with at least one of the transistor portion 70 including a transistor element such as an IGBT or a diode portion 80 including a diode element such as a freewheeling diode (FWD). In the example of FIG. 2A, transistor portions 70 and diode portions 80 are alternately arranged along a predetermined array direction (the X-axis direction in the present example) at the front surface 21 of the semiconductor substrate 10. In another example, the active portion 120 may be provided with only one of the transistor portion 70 and the diode portion 80.

In the present example, a region where the transistor portion 70 is arranged is denoted by a symbol "I", and a region where the diode portion 80 is arranged is denoted by a symbol "F". Each of the transistor portions 70 and the diode portions 80 may have a longitudinal length in the extending direction. In other words, the length of each of the transistor portions 70 in the Y-axis direction is larger than the width in the X-axis direction. Similarly, the length of each of the diode portions 80 in the Y-axis direction is larger than the width in the X-axis direction. The extending direction of the transistor portion 70 and the diode portion 80, and the longitudinal direction of each trench portion described later may be the same.

The diode portion 80 is a region obtained by projecting a cathode region 82 provided in the back surface 23 side of the semiconductor substrate 10 onto the upper surface of the semiconductor substrate 10. The cathode region 82 will be described later. On the back surface 23 of the semiconductor substrate 10, a P+ type of collector region 22 may be provided in a region other than the cathode region 82. In the present specification, the diode portion 80 may also include an extension region 85 where the diode portion 80 extends in the Y-axis direction to a gate runner which will be described below. On the back surface 23 of the extension region 85, the collector region 22 may be provided.

The semiconductor device 100 may have one or more pads above the semiconductor substrate 10. The semiconductor device 100 in the present example has a gate pad 112. The semiconductor device 100 may include a pad such as an anode pad and a cathode pad. Each pad is arranged in the vicinity of the end side 102. The vicinity of the end side 102 refers to a region between the end side 102 and the emitter electrode 52 in a top view. When the semiconductor device 100 is mounted, each pad may be connected to an external circuit through a wiring such as a wire.

A gate potential is applied to the gate pad 112. The gate pad 112 is electrically connected to the gate conductive portion 44 of the gate trench portion 40 in the active portion 120. The semiconductor device 100 includes a gate runner which connects the gate pad 112 and the gate trench portion 40. In FIG. 2A, the gate runner is hatched with diagonal lines.

The gate runner of the present example has an outer circumferential gate runner 130 and an inter-active-portion gate runner 131. The gate runner may be composed of either one of the gate metal layer 50 or the connection portion 25, or may be composed of a combination of both as appropriate. The outer circumferential gate runner 130 and the inter-active-portion gate runner 131 may have the same configuration or may have a different configuration. The outer circumferential gate runner 130 is arranged between the active portion 120 and the end side 102 of the semiconductor substrate 10 in the top view. The outer circumferential gate runner 130 of the present example surrounds the active portion 120, as seen in the top view. In the top view, a region surrounded by the outer circumferential gate runner 130 may also be set as the active portion 120. In addition, the outer circumferential gate runner 130 is connected to the gate pad 112. The outer circumferential gate runner 130 is arranged above the semiconductor substrate 10. The outer circumferential gate runner 130 may be composed of the gate metal layer 50 and the connection portion 25.

The inter-active-portion gate runner 131 is provided between a plurality of active portions 120. In FIG. 2A, two active portions 120 are arranged side by side in the Y-axis direction. Providing the inter-active-portion gate runner 131 between the plurality of active portions 120 inside the semiconductor substrate 10 can reduce a variation in wiring length from the gate pad 112 for each region of the semiconductor substrate 10.

The inter-active-portion gate runner 131 is connected to the gate trench portion of the active portion 120. The inter-active-portion gate runner 131 is arranged above the semiconductor substrate 10. The inter-active-portion gate runner 131 of the present example is composed of the gate metal layer 50 and the connection portion 25. The gate metal layer 50 may be a metal layer including aluminum or the like.

The inter-active-portion gate runner 131 may be connected to the outer circumferential gate runner 130. The inter-active-portion gate runner 131 of the present example is provided extending in the X-axis direction from one outer circumferential gate runner 130 to another outer circumferential gate runner 130 substantially at the center of the Y-axis direction, so as to cross the active portion 120. When the active portion 120 is divided by the inter-active-portion gate runner 131, the transistor portion 70 and the diode portion 80 may be alternately arranged in the X-axis direction in each divided region.

An edge termination structure portion 140 is provided at the front surface 21 of the semiconductor substrate 10. The edge termination structure portion 140 is provided between the active portion 120 and the end side 102 in a top view. The edge termination structure portion 140 in the present example is arranged between the outer circumferential gate runner 130 and the end side 102. The edge termination structure portion 140 reduces electric field strength on the front surface 21 side of the semiconductor substrate 10. The edge termination structure portion 140 may include at least one of a guard ring, a field plate, or a RESURF which is annularly provided to enclose the active portion 120.

Figure 2B:
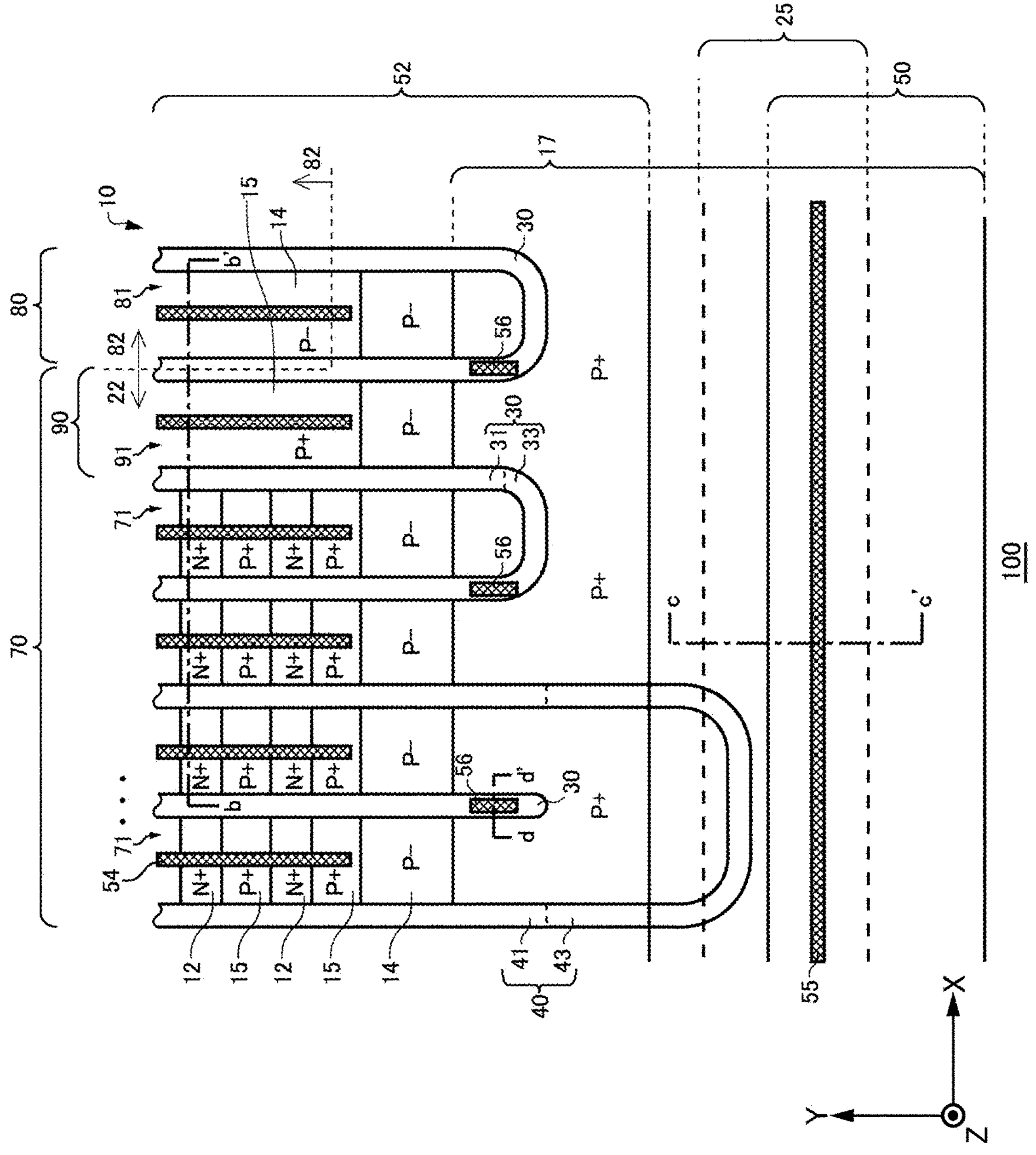
FIG. 2B illustrates a top view of a modification example of the semiconductor device 100.

FIG. 2B illustrates a top view of the modification example of the semiconductor device 100. The semiconductor device 100 in the present example includes the transistor portion 70 and a diode portion 80. The present figure is an enlarged view of the upper surface of the region A in FIG. 2A.

The semiconductor device 100 of the present example includes a gate trench portion 40, a dummy trench portion 30, an emitter region 12, a base region 14 a contact region 15, and a well region 17 provided inside the front surface 21 side of the semiconductor substrate 10. The gate trench portion 40 and the dummy trench portion 30 each are an example of the trench portion.

Similarly to the gate trench portion 40, each of the dummy trench portions 30 in the present example may have a U shape at the front surface 21 of the semiconductor substrate 10. That is, the dummy trench portion 30 may have two extending parts 31 which extend along the extending direction and a connecting part 33 which connects two extending parts 31.

The semiconductor device 100 in the present example includes the emitter electrode 52 and the gate metal layer 50 which are provided above the front surface 21 of the semiconductor substrate 10. The emitter electrode 52 and the gate metal layer 50 are provided separately from each other. The transistor portion 70 of the present example includes a boundary portion 90 that is positioned at a boundary between the transistor portion 70 and the diode portion 80. It is to be noted that the semiconductor device 100 does not need to include the boundary portion 90.

The boundary portion 90 is a region which is provided in the transistor portion 70 and is in direct contact with the diode portion 80. The boundary portion 90 includes the contact region 15 in the front surface 21 of the semiconductor substrate 10. The boundary portion 90 of the present example does not include the emitter region 12. In an example, the trench portions in the boundary portion 90 are the dummy trench portions 30. The boundary portion 90 of the present example is arranged such that both ends thereof in the X-axis direction become the dummy trench portions 30.

The contact hole 54 is provided above the base region 14 in the diode portion 80. The contact hole 54 is provided above the contact region 15 in the boundary portion 90. No contact holes 54 are provided above the well regions 17 provided at both ends in the Y-axis direction.

The mesa portion 91 is provided in the boundary portion 90. The mesa portion 91 has the contact region 15 at the front surface 21 of the semiconductor substrate 10. The mesa portion 91 in the present example has the base region 14 and the well region 17 on a negative side in the Y-axis direction.

The mesa portion 81 is provided in a region sandwiched between the dummy trench portions 30 adjacent to each other in the diode portion 80. The mesa portion 81 includes the base region 14 in the front surface 21 of the semiconductor substrate 10. The mesa portion 81 of the present example includes the well region 17 on the negative side in the Y-axis direction.

The emitter region 12 is provided in the mesa portion 71, but may not be provided in the mesa portion 81 and the mesa portion 91. The contact region 15 is provided in the mesa portion 71 and the mesa portion 91, but may not be provided in the mesa portion 81.

Figure 2C:
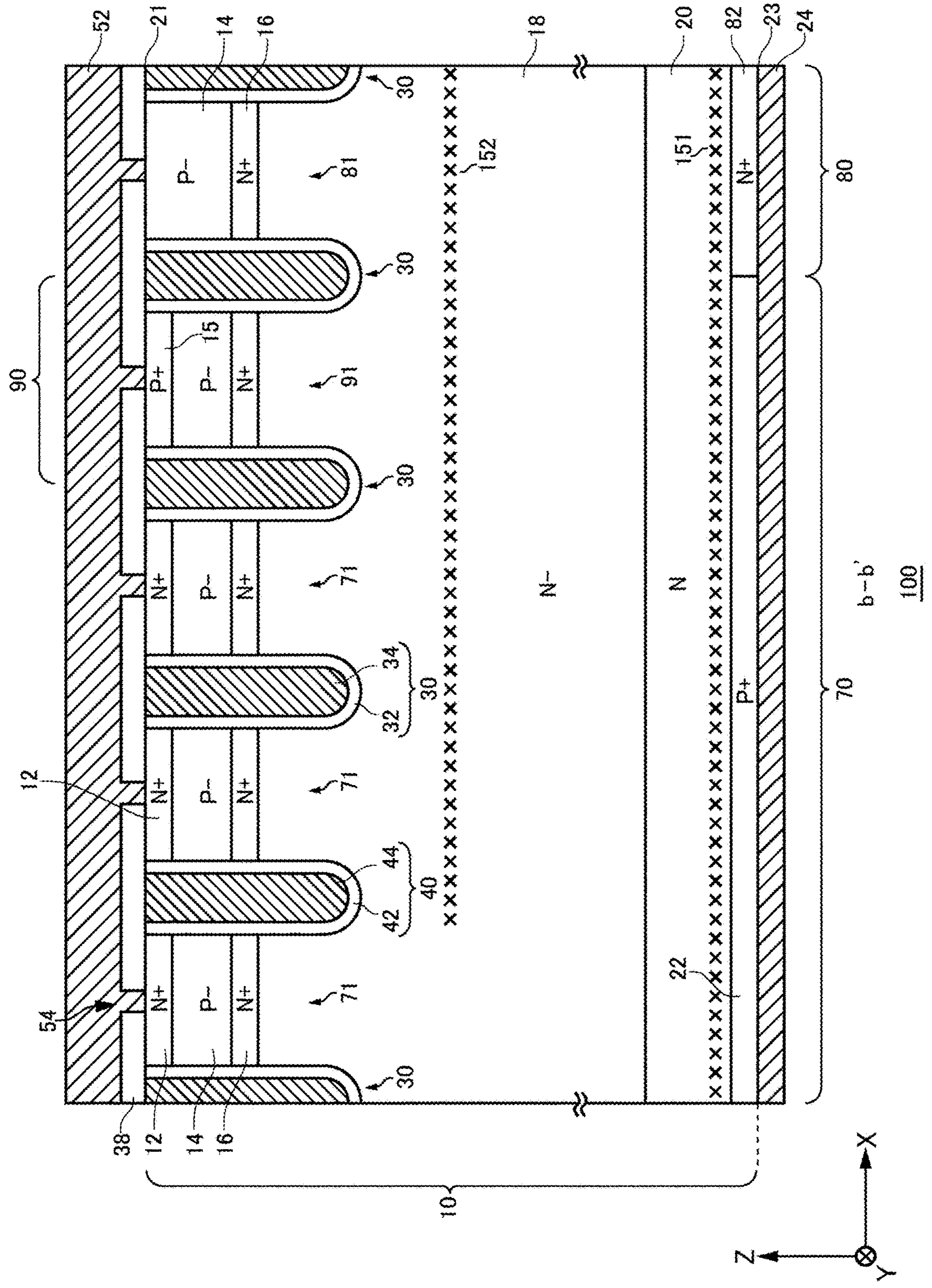
FIG. 2C illustrates a cross section b-b' of the modification example of the semiconductor device 100.

FIG. 2C illustrates a cross section b-b' of the modification example of the semiconductor device 100. The present figure corresponds to the cross section b-b' in FIG. 2B. The semiconductor device 100 of the present example includes the back surface side lifetime control region 151 and a front-surface-side lifetime control region 152. However, the semiconductor device 100 may not include one of the back surface side lifetime control region 151 or the front-surface-side lifetime control region 152. The semiconductor device 100 of the present example includes the collector region 22 and the cathode region 82 on the back surface 23 side of the buffer region 20.

The contact region 15 is provided above the base region 14 in the mesa portion 91. The contact region 15 is provided in contact with the dummy trench portion 30 in the mesa portion 91. In another cross section, the contact region 15 may be provided at the front surface 21 in the mesa portion 71.

The accumulation region 16 is provided in the transistor portion 70 and the diode portion 80. The accumulation region 16 in the present example is provided at entire surfaces of the transistor portion 70 and the diode portion 80. It is to be noted that the accumulation region 16 may not be provided in the diode portion 80.

A cathode region 82 is provided below the buffer region 20 in the diode portion 80. A boundary between the collector region 22 and the cathode region 82 is a boundary between the transistor portion 70 and the diode portion 80. That is, the collector region 22 is provided below the boundary portion 90 of the present example.

The back surface side lifetime control region 151 is provided in both of the transistor portion 70 and the diode portion 80. This allows the semiconductor device 100 in the present example to speed up recovery in the diode portion 80 and further improve a switching loss. The back surface side lifetime control region 151 may be formed by a method similar to that of the back surface side lifetime control region 151 in other examples.

The front-surface-side lifetime control region 152 is provided closer to the front surface 21 than the center of the semiconductor substrate 10 in the depth direction of the semiconductor substrate 10. The front-surface-side lifetime control region 152 of the present example is provided in the drift region 18. The front-surface-side lifetime control region 152 is provided in both of the transistor portion 70 and the diode portion 80. The front-surface-side lifetime control region 152 may be provided in the diode portion 80 and the boundary portion 90 and not be provided in a part of the transistor portion 70. The front-surface-side lifetime control region 152 can suppress the implantation of holes from the diode portion 80 and the transistor portion 70 to reduce a reverse recovery loss.

The front-surface-side lifetime control region 152 may be formed by any of the methods for forming the back surface side lifetime control region 151. The element, the dose amount, and the like for forming the back surface side lifetime control region 151 may be the same as or different from those for forming the front-surface-side lifetime control region 152.

The front-surface-side lifetime control region 152 is provided so as to extend from the diode portion 80 to the transistor portion 70. The front-surface-side lifetime control region 152 may be formed by an irradiation from the front surface 21 of the semiconductor substrate 10. The front-surface-side lifetime control region 152 may alternatively be formed by an irradiation from the back surface 23 side of the semiconductor substrate 10. The front-surface-side lifetime control region 152 of the present example is provided below the gate trench portion 40. Due to particle beams or the like for forming the front-surface-side lifetime control region 152 passing through the MOS gate structure of the semiconductor device 100, a defect may be generated at an interface between the gate oxide film and the semiconductor substrate.

The semiconductor device 100 may be a power semiconductor device for controlling electrical power, and the like. The semiconductor device 100 of the present example may have a vertical semiconductor structure in which a back-surface-side metal layer is provided on the back surface 23 side in the semiconductor substrate 10. Note that, a semiconductor device 100 can have horizontal semiconductor structure in which no metal layer is provided on a back surface 23 side.

It is to be noted that in the present example, an RC-IGBT having a trench gate structure is described as an example of the semiconductor device 100. It is to be noted that the semiconductor device 100 may be a semiconductor device having a planar gate structure, or may be other semiconductor devices such as a diode. The semiconductor device 100 may include an N-channel MOSFET or P-channel MOSFET.

Figure 3A:
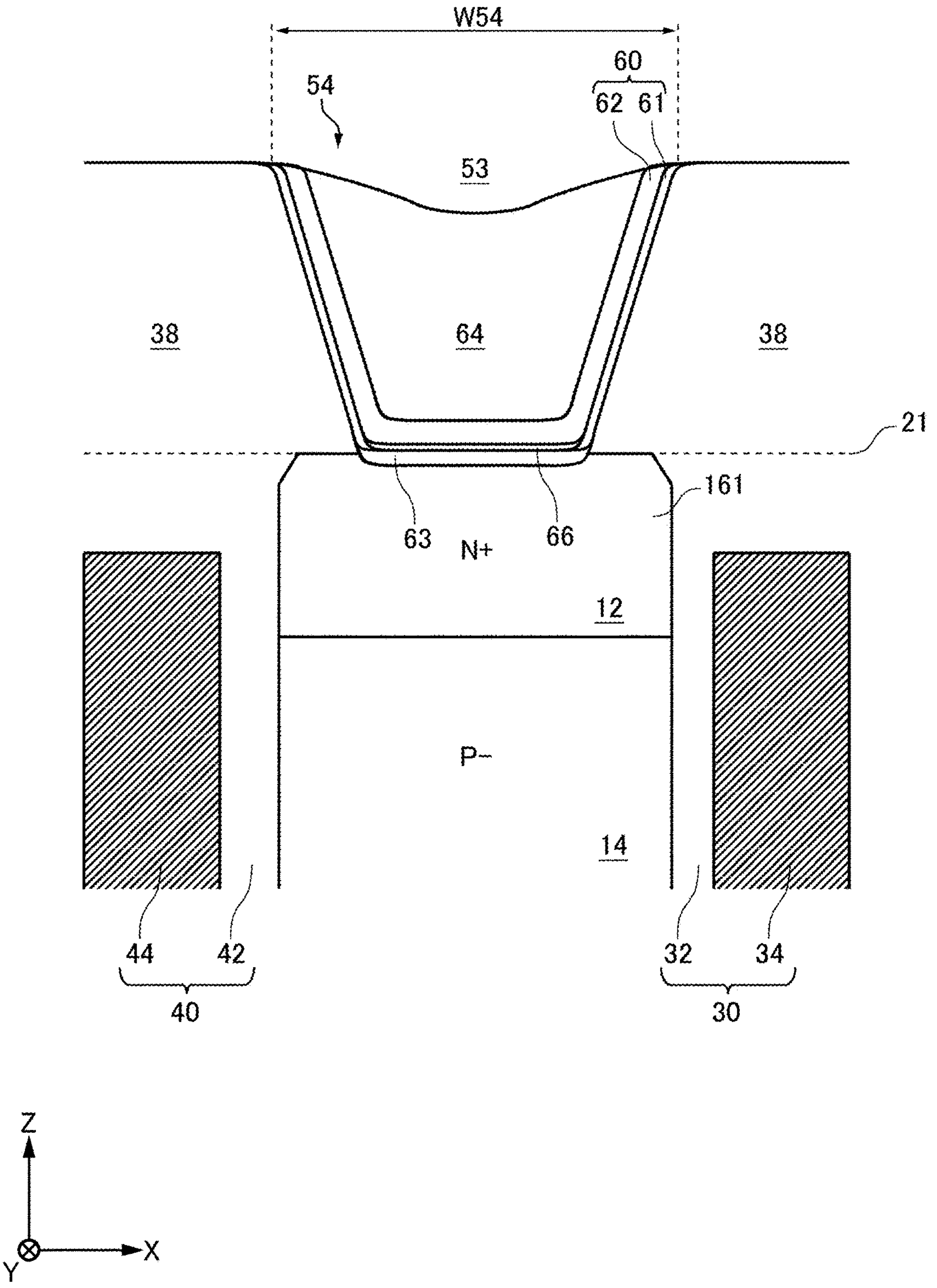
FIG. 3A is an enlarged view of the cross section of the semiconductor device 100.

FIG. 3A is an enlarged view of a cross section of the semiconductor device 100. In the present example, an enlarged view of a cross section in the vicinity of the contact hole 54 is shown. The cross section of the present example is an X-Z cross section that passes through the emitter region 12 in the front surface 21 of the semiconductor substrate 10. The emitter region 12 is an example of the first conductivity-type region 161. The semiconductor device 100 includes a barrier metal layer 60, a first alloy layer 63, a plug layer 64, and an oxide layer 66.

It is to be noted that in the present specification, the contact hole 54 may be used to describe the structure in the vicinity of the contact hole, but similar structures may also be applied to other contact holes such as the contact hole 55 and the contact hole 56. That is, the barrier metal layer 60, the first alloy layer 63, the plug layer 64, and the oxide layer 66 may be provided in other contact holes such as the contact hole 55 and the contact hole 56. The barrier metal layer 60, the first alloy layer 63, the plug layer 64, and the oxide layer 66 may also be provided in the contact hole 58 to be described below.

The barrier metal layer 60 is provided above the oxide layer 66 in the contact hole 54. The barrier metal layer 60 is provided on a bottom surface of the contact hole 54 and on a side wall of the interlayer dielectric film 38. The barrier metal layer 60 may be provided in contact with the upper surface of the interlayer dielectric film 38. The barrier metal layer 60 of the present example is provided on the upper surface of the oxide layer 66 and on the side wall of the interlayer dielectric film 38 in the contact hole 54. The barrier metal layer 60 includes a first metal having a predetermined conductivity. The first metal may be at least one of titanium (Ti), cobalt (Co), nickel (Ni), tantalum (Ta), magnesium (Mg), vanadium (V), lanthanum (La), palladium (Pd), or zirconium (Zr). The first metal may be a metal that has a hydrogen-absorbing effect. The barrier metal layer 60 of the present example includes a first barrier metal portion 61 and a second barrier metal portion 62.

The first barrier metal portion 61 is provided on the side wall of the interlayer dielectric film 38 in the contact hole 54. The first barrier metal portion 61 may include a first metal having a predetermined conductivity. For example, the first barrier metal portion 61 is of TiN. The first barrier metal portion 61 may be a hydrogen-absorbing metal. The first barrier metal portion 61 is formed by annealing an initial metal film including the first metal. The first barrier metal portion 61 of the present example is of TiN formed by annealing Ti, which has been deposited as the initial metal film on the side wall of the interlayer dielectric film 38, in a nitrogen atmosphere.

The second barrier metal portion 62 is stacked on the first barrier metal portion 61 in the contact hole 54. The second barrier metal portion 62 includes a conductive material. For example, the second barrier metal portion 62 is of TiN. The second barrier metal portion 62 is provided to be stacked on the first alloy layer 63 that is provided on the upper surface of the semiconductor substrate 10. The second barrier metal portion 62 may be formed by sputtering a conductive material. The second barrier metal portion 62 of the present example is of TiN formed by sputtering. The second barrier metal portion 62 may be provided in contact with the first barrier metal portion 61 and the oxide layer 66.

The first alloy layer 63 is provided on the upper surface of the semiconductor substrate 10 below the contact hole 54. The first alloy layer 63 of the present example is provided on the upper surface of the semiconductor substrate 10. The first alloy layer 63 is formed by annealing the initial metal film including the first metal. The first alloy layer 63 may be an alloy formed of the first metal and a constituent element of the layer on the bottom surface of the contact hole 54. As an example, when the semiconductor substrate 10 is a silicon substrate, the first alloy layer 63 may be a silicide layer. As another example, when the semiconductor substrate 10 is a silicon carbide substrate, a gallium nitride substrate, a diamond substrate or the like, the first alloy layer 63 may be an alloy layer that includes the first metal and these substrate materials. The first alloy layer 63 of the present example is a titanium silicide layer formed by annealing Ti that has been deposited as the initial metal film on the bottom surface of the contact hole 54. The N-type regions including the first conductivity-type region 161 may be formed so that the concentration of the N-type impurity becomes high at the position where it is in contact with the first alloy layer 63, allowing reduction of the contact resistance.

The first barrier metal portion 61 and the first alloy layer 63 may be formed in the same annealing process. For example, the first barrier metal portion 61 of TiN is formed on the side wall of the interlayer dielectric film 38, and the first alloy layer 63 of titanium silicide is formed on the upper surface of the semiconductor substrate 10. Note that, the entire initial metal film formed may be used to form the first barrier metal portion 61 or the first alloy layer 63 and no initial metal film may be left. The initial metal film may be left on the first alloy layer 63 to form the metal film 67, which is to be described below, and the first barrier metal portion 61 may be formed on the first alloy layer 63 or the metal film 67.

The plug layer 64 is provided above the barrier metal layer 60 in the contact hole 54. The plug layer 64 may be provided in contact with the second barrier metal portion 62 in the contact hole 54. The plug layer 64 is a conductive material that is filled inside the contact hole 54. The material of the plug layer 64 may be different from that of the front-surface-side metal layer 53. For example, the material of the plug layer 64 is tungsten. Note that, the plug layer 64 may be provided even on the outside of the contact hole 54, in contact with the second barrier metal portion 62 above the interlayer dielectric film 38. The plug layer 64 may be omitted and the front-surface-side metal layer 53 may be filled inside the contact hole 54. As will be described below, the plug layer 64 may penetrate inside the second barrier metal portion 62 in some cases.

The oxide layer 66 is provided on the upper surface of the first alloy layer 63 in the contact hole 54. The oxide layer 66 may be in contact with the upper surface of the first alloy layer 63 or may be in contact with the lower surface of the barrier metal layer 60. The oxide layer 66 may be provided in contact with the first alloy layer 63 and the barrier metal layer 60. That is, the oxide layer 66 may be provided to be stacked between the first alloy layer 63 and the barrier metal layer 60. Note that, when the first barrier metal portion 61 or the metal film 67 is formed on the upper surface of the first alloy layer 63, the oxide layer 66 may be formed on the first barrier metal portion 61 or the metal film 67. In addition, the oxide layer 66 may be formed below the second barrier metal portion 62 on the side wall of the interlayer dielectric film 38 in the contact hole 54.

The oxide layer 66 may include elements that constitute the first alloy layer 63, the first barrier metal portion 61, or the metal film 67. The oxide layer 66 may include elements that constitute the semiconductor substrate 10, or oxides of silicon. For example, the oxide layer 66 is a silicon oxide film. Composition of the oxide layer 66 may be at least one of SiO, $SiO_2$, or $Si_2O_3$. The oxide layer 66 may include a first metal having a predetermined conductivity. For example, the oxide layer 66 may include titanium, and may include a titanium oxide film. The composition of the oxide layer 66 may be at least one of TiO, $TiO_2$, or $Ti_2O_3$. The oxide layer 66 may be such a dense film that functions as a metal-diffusion-prevention layer. For example, the oxide layer 66 can prevent the plug layer 64 from diffusing during deposition of the plug layer 64 and protect the first alloy layer 63 from damages caused by the deposition of the plug layer 64.

The film thickness of the oxide layer 66 may be thinner than the film thickness of the first alloy layer 63. The film thickness of the oxide layer 66 may be thinner than the film thickness of the second barrier metal portion 62. The film thickness of the oxide layer 66 may be 0.5 nm or more and 4.0 nm or less. For example, the film thickness of the oxide layer 66 is 2.5 nm. The film thickness of the oxide layer 66 may be the film thickness at the thickest position in the contact hole 54.

The oxide layer 66 may be formed by exposure to chemicals, such as etching. The oxide layer 66 may be formed by etching an upper surface of the first alloy layer 63, the first barrier metal portion 61, or the metal film 67. Etching of the upper surface of the first alloy layer 63, the first barrier metal portion 61, or the metal film 67 may be wet etching or dry etching. The oxide layer 66 may be formed by the dry etching of the upper surface of the first alloy layer 63. Alternatively, the oxide layer 66 may be formed by oxidation of an upper surface of the first alloy layer 63, the first barrier metal portion 61, or the metal film 67. The oxide layer 66 may be formed by annealing the semiconductor substrate 10 in the oxygen atmosphere. The oxide layer 66 may be formed by being deposited on the first alloy layer 63, on the first barrier metal portion 61, on the metal film 67, or on the interlayer dielectric film 38.

The interlayer dielectric film 38 includes the contact hole 54 and is provided above the semiconductor substrate 10. Although the interlayer dielectric film 38 includes one layer of a dielectric film provided above the front surface 21, the interlayer dielectric film 38 may alternatively include a plurality of stacked dielectric films. The interlayer dielectric film 38 may be a silicon oxide film such as BPSG.

The first barrier metal portion 61 is denser than the second barrier metal portion 62. The first barrier metal portion 61 and the second barrier metal portion 62 may be formed by different deposition methods. The first barrier metal portion 61 may be a TiN film formed by annealing Ti that has been deposited on the side wall of the interlayer dielectric film 38. The second barrier metal portion 62 may be a TiN film formed by the sputtering of TiN. Thus, the first barrier metal portion 61 may be a TiN film that is denser than the second barrier metal portion 62. The first barrier metal portion 61 and the second barrier metal portion 62 may include the same material.

By the first barrier metal portion 61 being formed to be dense, the interlayer dielectric film 38 can be protected from damages caused by the deposition of the plug layer 64. On the other hand, in the second barrier metal portion 62 formed by sputtering, since it is not necessary to form the initial metal film, an influence of the hydrogen-absorbing effect due to remaining Ti or the like can be avoided. However, since the second barrier metal portion 62 is not as dense as the first barrier metal portion 61, the plug layer 64 may penetrate the second barrier metal portion 62 during formation of the plug layer 64.

The film thickness of the first barrier metal portion 61 may be thinner than the film thickness of the second barrier metal portion 62. The film thickness of the first barrier metal portion 61 may be thinner than the film thickness of the first alloy layer 63. The first barrier metal portion 61 may be made thinner by etching after the formation of the dense film. The etching performed after the formation of the dense film may be performed using chemical liquid. The chemical liquid used for performing the etching may be, for example, hydrofluoric acid, ammonia hydrogen peroxide, sulfuric acid, or the like. The ammonia hydrogen peroxide is a mixed liquid of ammonia ($NH_4OH$), hydrogen peroxide ($H_2O_2$), and water ($H_2O$). The etching after the formation of the dense film may be dry etching, reverse sputtering, or the like. The film thickness of the first barrier metal portion 61 may be 1 nm or more and 10 nm or less. The film thickness of the first barrier metal portion 61 may be the film thickness at the thickest position in the contact hole 54. The film thickness of the first barrier metal portion 61 may be formed to be in a predetermined range throughout the side wall of the interlayer dielectric film 38. The film thickness of the second barrier metal portion 62 may be 1 nm or more and 100 nm or less. The film thickness of the first alloy layer 63 may be 1 nm or more and 200 nm or less.

The first barrier metal portion 61 may cover the side wall of the interlayer dielectric film 38. The lower end of the first barrier metal portion 61 may be in contact with the oxide layer 66. That is, the bottom surface of the contact hole 54 and the side wall of the interlayer dielectric film 38 may be covered by the oxide layer 66 and the first barrier metal portion 61, respectively. Thus, erosion of the interlayer dielectric film 38 and the first alloy layer 63 due to a gas during deposition of the plug layer 64 can be avoided.

An opening width W54 of the contact hole 54 is a width of the contact hole 54 in the trench array direction on the upper surface of the interlayer dielectric film 38. The opening width W54 of the contact hole 54 may be 100 nm or more and 1000 nm or less.

Herein, when electron beams, particle beams, and the like for forming the lifetime control region pass through the MOS gate structure, a defect may be generated in the vicinity of an interface between the oxide film and the semiconductor layer in the MOS gate structure. Then, when metal such as Ti having a hydrogen-absorbing effect exists in the vicinity of the MOS gate structure, hydrogen diffused in the gate portion may be absorbed so as to result in an inhibition of a hydrogen termination of a dangling bond of the MOS gate structure and a variation of a threshold voltage.

An unreacted initial metal film having the hydrogen-absorbing effect may remain on the upper surface of the first alloy layer 63. In the semiconductor device 100 of the present example, the remaining amount of the initial metal film having the hydrogen-absorbing effect may be reduced by etching and oxidizing the upper surface of the first alloy layer 63, allowing the formation of the oxide layer 66. In addition, in the semiconductor device 100 of the present example, the remaining amount of the first metal film having the hydrogen-absorbing effect can be reduced by making the first barrier metal portion 61 thinner. Thus, the influence of the hydrogen-absorbing effect can be suppressed and the hydrogen termination of dangling bonds in the MOS gate structure can be promoted. Accordingly, a variation of the threshold voltage can be suppressed.

By having the oxide layer 66, the semiconductor device 100 can ensure the barrier property during the deposition of the plug layer 64. In the semiconductor device 100 of the present example, the variation of the threshold voltage can be suppressed while enhancing the reliability on the front surface 21 side. In addition, in the semiconductor device 100, the reverse recovery loss can be reduced because the lifetime control region can be formed while suppressing the variation of the threshold voltage.

It is to be noted that although an influence of the electron beams and particle beams for forming the lifetime control region on the MOS gate structure becomes large when irradiating the beams from the front surface 21 side of the semiconductor substrate 10, the beams may affect the MOS gate structure also when being irradiated from the back surface 23 side of the semiconductor substrate 10. Thus, also when irradiating from the back surface 23 side, the semiconductor device 100 can recover the damage of the MOS gate structure and suppress the variation of the threshold voltage. It is to be noted that although an acceleration voltage becomes large to result in an increase in the size of the device when irradiating particle beams and the like from the back surface 23 side of the semiconductor substrate 10, in the semiconductor device 100 of the present example, the influence of irradiating particle beams and the like from the front surface 21 can be suppressed, and thus the lifetime control region can be formed with a more compact device.

The first conductivity-type region 161 is a region that is provided on the front surface 21 of the semiconductor substrate 10 and that is of the first conductivity type having a higher doping concentration than the drift region 18. The first conductivity-type region 161 may be an N-type region of the transistor portion 70. The first conductivity-type region 161 of the present example is the emitter region 12, although it is not limited to this. The first conductivity-type region 161 may be an N-type region in the MOSFET. The first conductivity-type region 161 may be the N-type region provided other than in the transistor portion 70. The first conductivity-type region 161 may be the N-type region in the temperature-sensing diode. The first conductivity-type region 161 may be the N-type region in the diode portion of the RC-IGBT or the like.

Figure 3B:
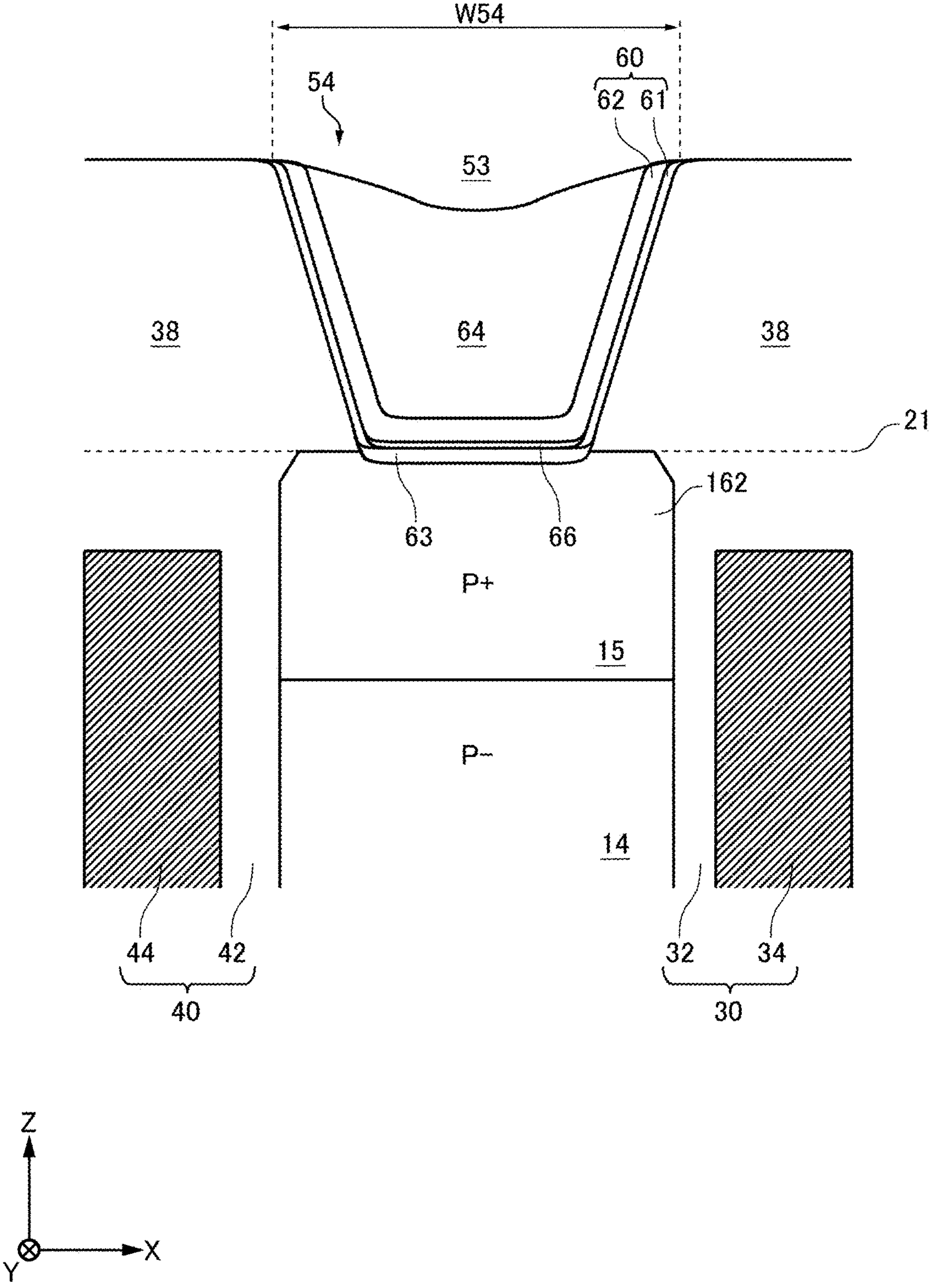
FIG. 3B is an enlarged view of the cross section of the semiconductor device 100.

FIG. 3B is an enlarged view of the cross section of the semiconductor device 100. The cross section of the present example is different from the cross section of FIG. 3A in that it passes through the contact region 15 in the front surface 21. The contact region 15 is an example of the second conductivity-type region 162. In the present example, difference with FIG. 3A will be particularly described.

The second conductivity-type region 162 is a region of second conductivity type provided in the front surface 21 of the semiconductor substrate 10. The second conductivity-type region 162 may be a P-type region in the transistor portion 70. The second conductivity-type region 162 of the present example is the contact region 15, although it is not limited to this. The second conductivity-type region 162 may be the P-type region in the MOSFET. The second conductivity-type region 162 may be the P-type region provided other than in the transistor portion 70. The second conductivity-type region 162 may be the P-type region in the temperature-sensing diode. The second conductivity-type region 162 may be the P-type region in the diode portion of the RC-IGBT or the like.

The structure of the contact hole 54 above the second conductivity-type region 162 may be the same as or different from the structure of the contact hole 54 above the first conductivity-type region 161. That is, the film thicknesses of the barrier metal layer 60, the first alloy layer 63, and the oxide layer 66 above the first conductivity-type region 161 may each be the same as those above the second conductivity-type region 162. In the present example, the film thickness of the oxide layer 66 provided above the second conductivity-type region 162 is the same as the film thickness of the oxide layer 66 provided above the first conductivity-type region 161, although they may be different from each other. The film thickness of the oxide layer 66 above the second conductivity-type region 162 may be thinner than that above the first conductivity-type region 161. The P-type regions including the second conductivity-type region 162 may be formed so that the concentration of the P-type impurity becomes high at the position where it contacts the first alloy layer 63, allowing reduction of the contact resistance.

Figure 4A:
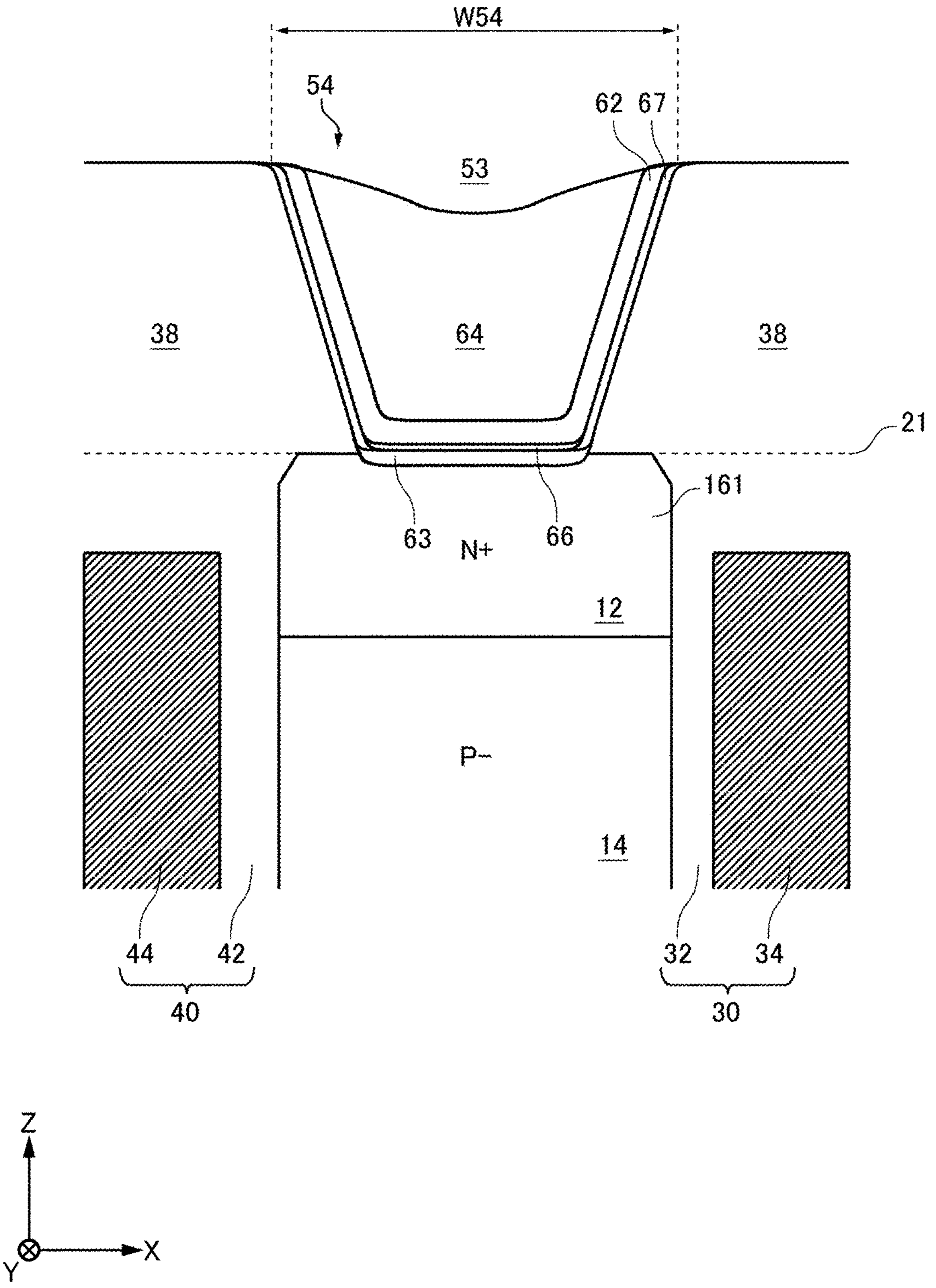
FIG. 4A is an enlarged view of the cross section of the semiconductor device 100.

FIG. 4A is an enlarged view of the cross section of the semiconductor device 100. The cross section of the present example is an X-Z cross section that passes through the emitter region 12 in the front surface 21 of the semiconductor substrate 10. The semiconductor device 100 of the present example is different from the example of FIG. 3A in that it does not include the first barrier metal portion 61 but it includes a metal film 67 between the second barrier metal portion 62 and the interlayer dielectric film 38.

The metal film 67 may be formed by the remaining initial metal film. That is, the initial metal film may remain in a process for forming the first alloy layer 63, and even after the etching performed in a process for forming the oxide layer 66, some of the initial metal film may remain and be formed into the metal film 67. The metal film 67 may be denser than the second barrier metal portion 62. The metal film 67 is provided on the side wall of the interlayer dielectric film 38 in the contact hole 54. The metal film 67 may be provided in contact with the upper surface of the interlayer dielectric film 38. The second barrier metal portion 62 is provided on the bottom surface of the contact hole 54 and on the side wall of the interlayer dielectric film 38. The second barrier metal portion 62 may be provided above the interlayer dielectric film 38 and the metal film 67 may be provided between the second barrier metal portion and the interlayer dielectric film 38. The second barrier metal portion 62 of the present example is provided on the upper surface of the oxide layer 66 and on the side wall of the interlayer dielectric film 38 in the contact hole 54, and the metal film 67 is provided between the side wall of the interlayer dielectric film 38 and the second barrier metal portion 62.

The first barrier metal portion 61 may or may not be formed. When the first barrier metal portion 61 is formed, the first barrier metal portion 61 may be formed on a surface of the metal film 67 by the annealing treatment in a process for forming the first alloy layer 63, then the first barrier metal portion 61 may be removed entirely by the etching in a process for forming the oxide layer 66.

Figure 4B:
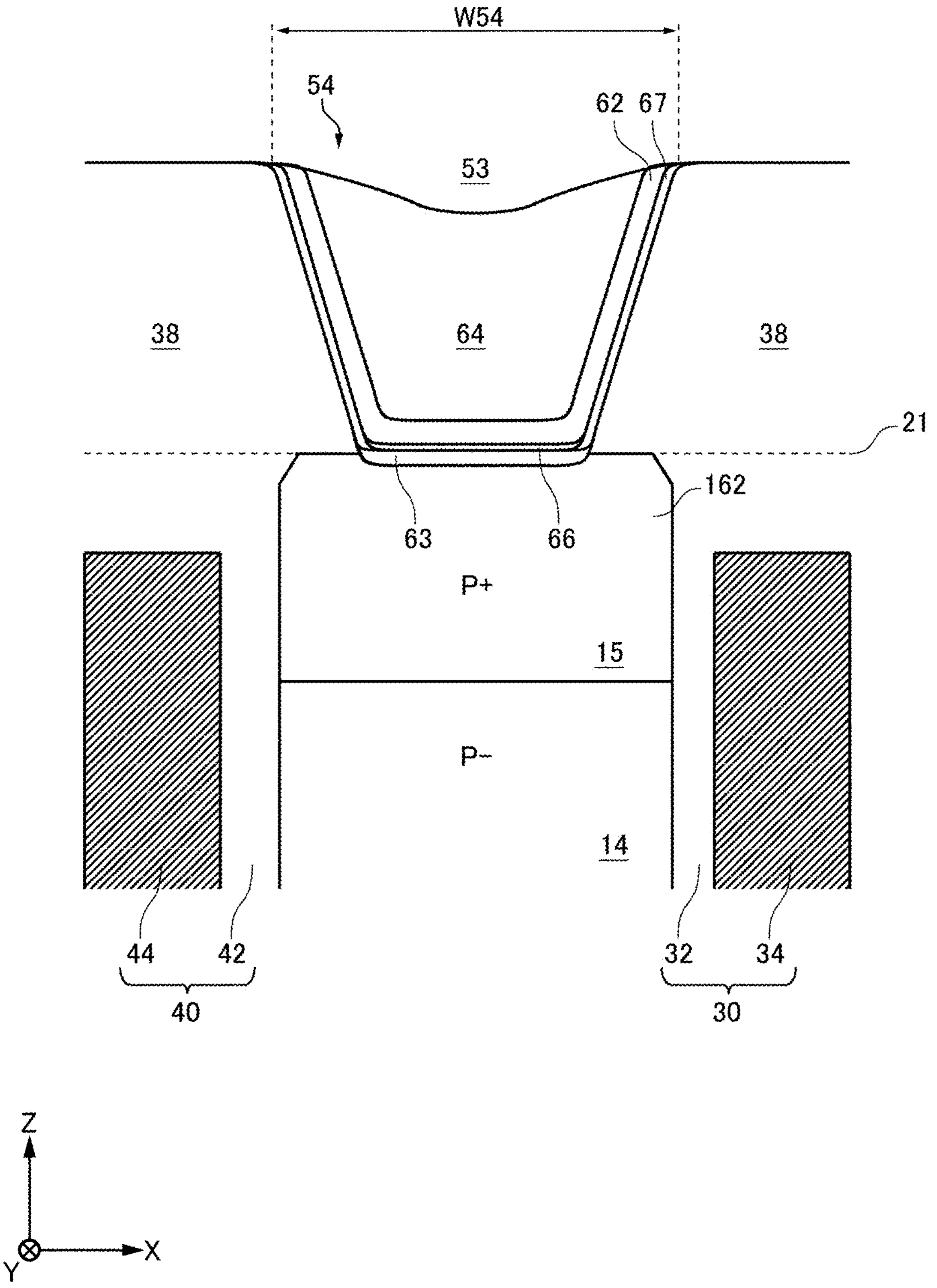
FIG. 4B is an enlarged view of the cross section of the semiconductor device 100.

FIG. 4B is an enlarged view of the cross section of the semiconductor device 100. The cross section of the present example is an X-Z plane that passes through the contact region 15 in the front surface 21 of the semiconductor substrate 10. The semiconductor device 100 of the present example is different from the example of FIG. 3B in that it does not include the first barrier metal portion 61 and that it includes the metal film 67 between the second barrier metal portion 62 and the interlayer dielectric film 38.

Also in the examples of FIG. 4A and FIG. 4B, by having the oxide layer 66, the semiconductor device 100 can ensure the barrier property during the deposition of the plug layer 64. In addition, by the metal film 67 becoming thinner due to etching in the process for forming the oxide layer 66, the influence of the hydrogen-absorbing effect can be suppressed and the hydrogen termination of dangling bonds in the MOS gate structure can be promoted. Accordingly, a variation of the threshold voltage can be suppressed.

Figure 5A:
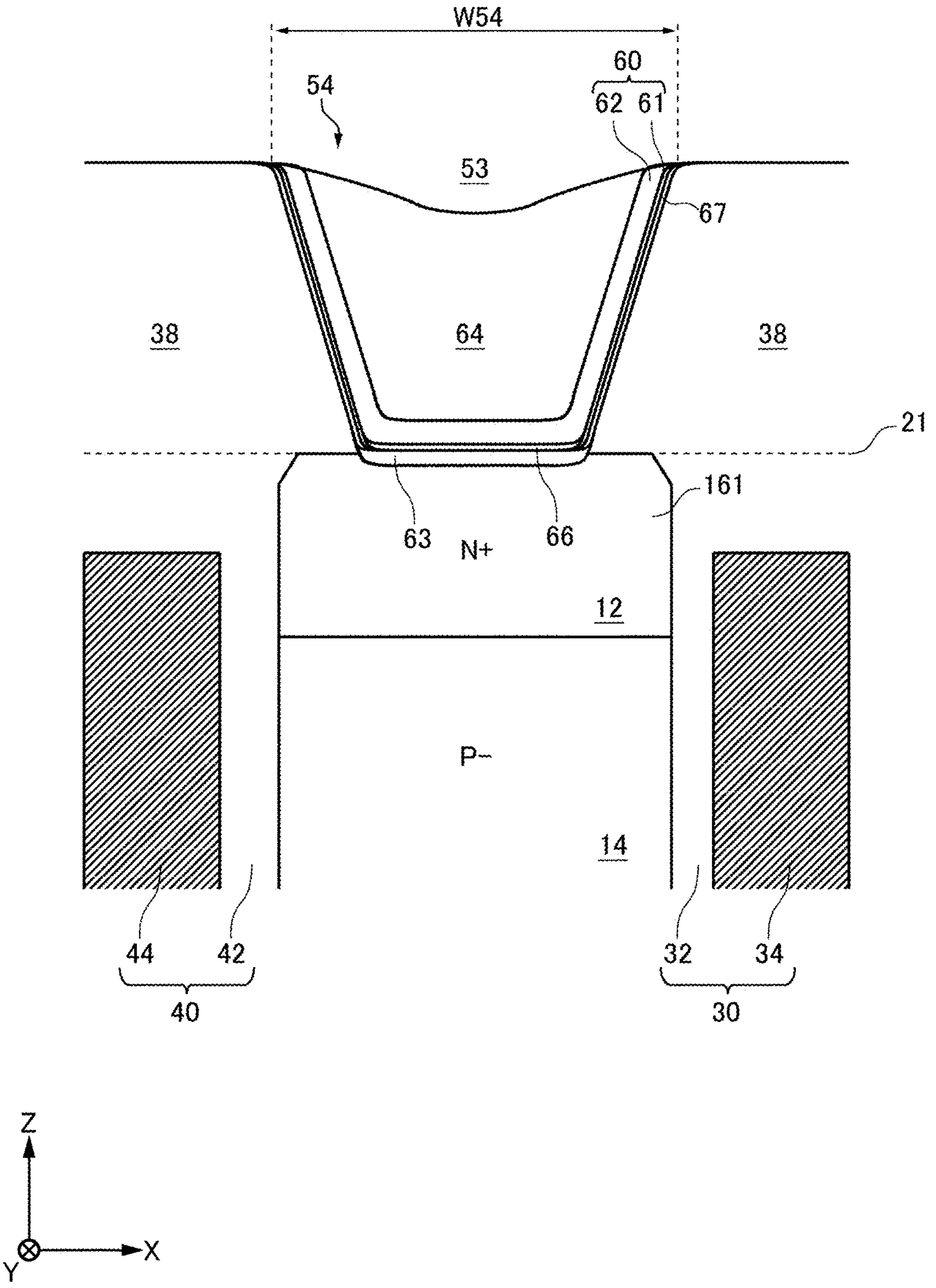
FIG. 5A is an enlarged view of the cross section of the semiconductor device 100.

FIG. 5A is an enlarged view of the cross section of the semiconductor device 100. The cross section of the present example is an X-Z cross section that passes through the emitter region 12 in the front surface 21 of the semiconductor substrate 10. The semiconductor device 100 of the present example is different from the examples of FIG. 3A and FIG. 4A in that it includes the metal film 67 between the first barrier metal portion 61 and the interlayer dielectric film 38.

The metal film 67 may be formed by the remaining initial metal film. In the present example, the metal film 67 remains while the first barrier metal portion 61 is formed by the annealing treatment in a process for forming the first alloy layer 63. Some of the first barrier metal portion 61 may remain even after the etching performed in a process for forming the oxide layer 66. The metal film 67 is provided on the side wall of the interlayer dielectric film 38 in the contact hole 54. The metal film 67 may be provided in contact with the upper surface of the interlayer dielectric film 38. The barrier metal layer 60 is provided on the bottom surface of the contact hole 54 and on the side wall of the interlayer dielectric film 38. The barrier metal layer 60 may be provided above the interlayer dielectric film 38 and the metal film 67 may be provided between the barrier metal layer 60 and the interlayer dielectric film 38. The barrier metal layer 60 of the present example is provided on the upper surface of the oxide layer 66 and on the side wall of the interlayer dielectric film 38 in the contact hole 54, and the metal film 67 is provided between the side wall of the interlayer dielectric film 38 and the barrier metal layer 60.

Figure 5B:
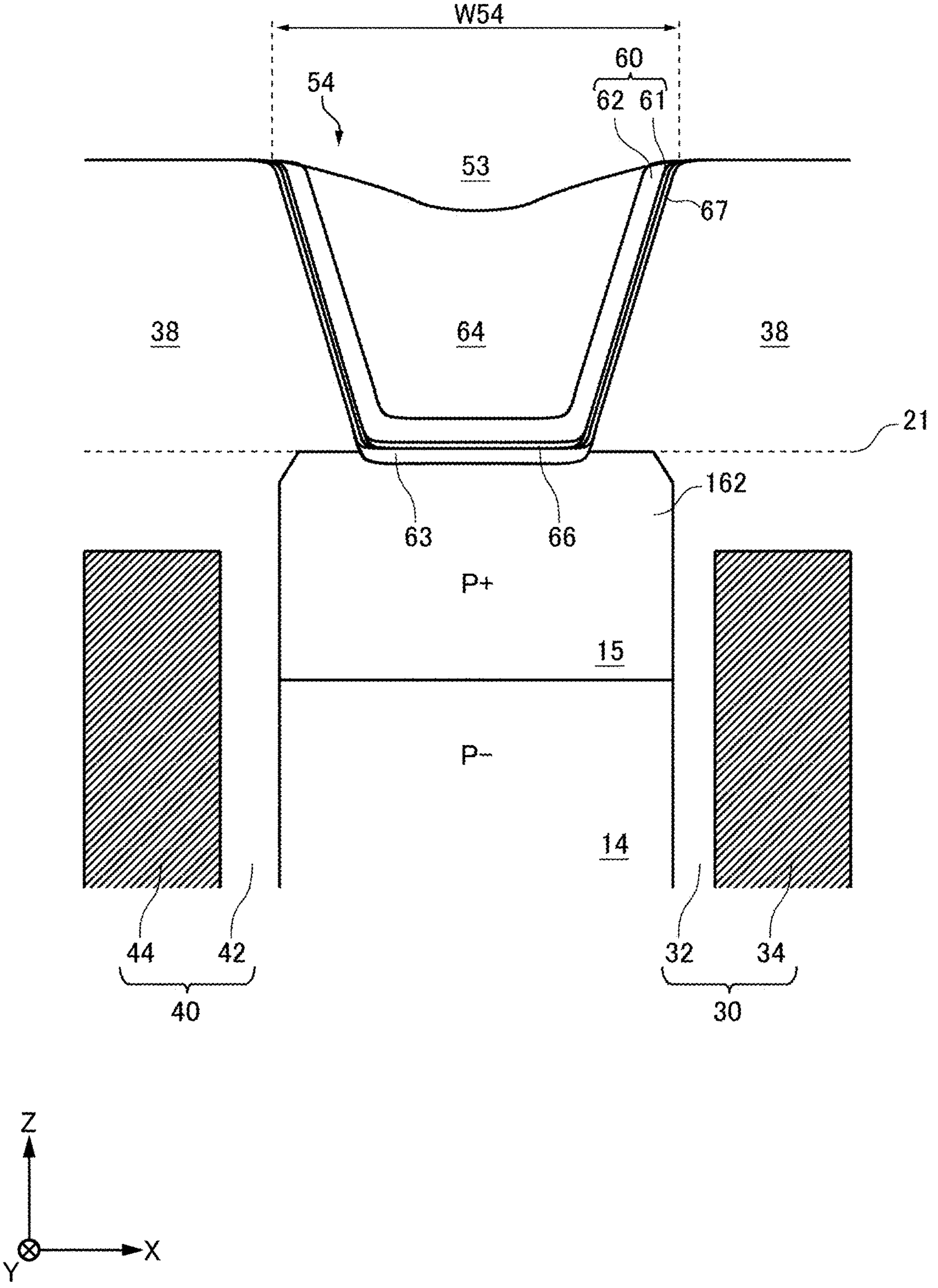
FIG. 5B is an enlarged view of the cross section of the semiconductor device 100.

FIG. 5B is an enlarged view of the cross section of the semiconductor device 100. The cross section of the present example is an X-Z plane that passes through the contact region 15 in the front surface 21 of the semiconductor substrate 10. The semiconductor device 100 of the present example is different from the examples of FIG. 3B and FIG. 4B in that it includes the metal film 67 between the first barrier metal portion 61 and the interlayer dielectric film 38.

Also in the examples of FIG. 5A and FIG. 5B, by having the oxide layer 66, the semiconductor device 100 can ensure the barrier property during the deposition of the plug layer 64. In addition, by the first barrier metal portion 61 becoming thinner due to etching in the process for forming the oxide layer 66, the influence of the hydrogen-absorbing effect can be suppressed and the hydrogen termination of dangling bonds in the MOS gate structure can be promoted. Accordingly, a variation of the threshold voltage can be suppressed.

Figure 6A:
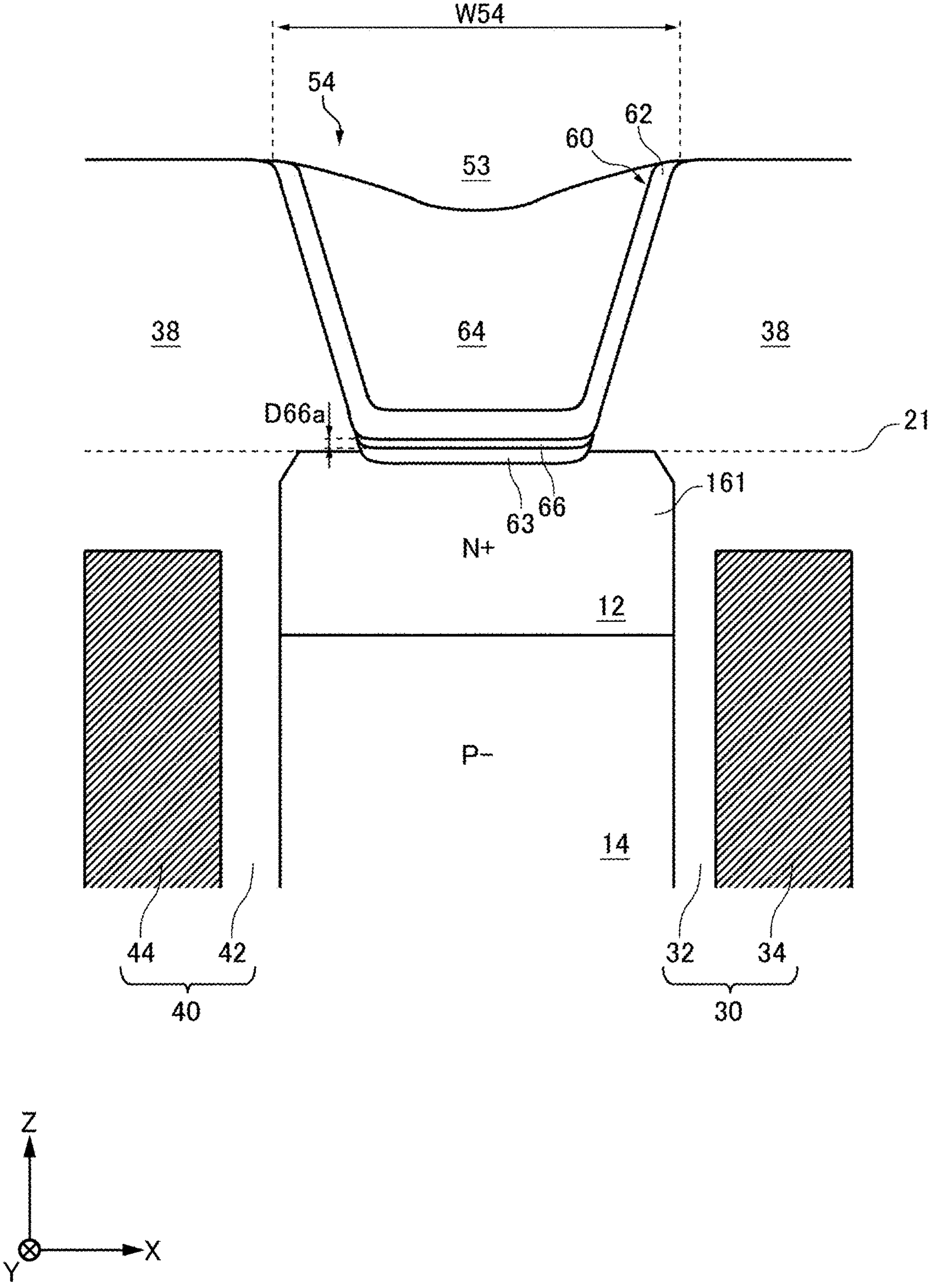
FIG. 6A is an enlarged view of the cross section of the semiconductor device 100.

FIG. 6A is an enlarged view of the cross section of the semiconductor device 100. In the present example, an enlarged view of a cross section in the vicinity of the contact hole 54 is shown. The cross section of the present example is an X-Z cross section that passes through the emitter region 12 in the front surface 21 of the semiconductor substrate 10. The semiconductor device 100 of the present example is different from the example of FIG. 3A in that it does not include the first barrier metal portion 61.

The barrier metal layer 60 includes the second barrier metal portion 62. The barrier metal layer 60 may not include the first barrier metal portion 61. The first barrier metal portion 61 formed during the formation of the first alloy layer 63 and/or the initial metal film remaining because the first barrier metal portion 61 is not formed, may be removed by etching. The second barrier metal portion 62 of the present example may be provided in contact with the side wall of the interlayer dielectric film 38. Note that, the second barrier metal portion 62 may be provided above the interlayer dielectric film 38.

The film thickness D66*a* is the thickness of the oxide layer 66 in the depth direction of the semiconductor substrate 10. In particular, the film thickness D66*a* may be the thickness of the oxide layer 66 above the first conductivity-type region 161 in the depth direction of the semiconductor substrate 10. The film thickness D66*a* may be the film thickness at the thickest position of the oxide layer 66. The film thickness D66*a* may be thinner than the film thickness of the first alloy layer 63.

Figure 6B:
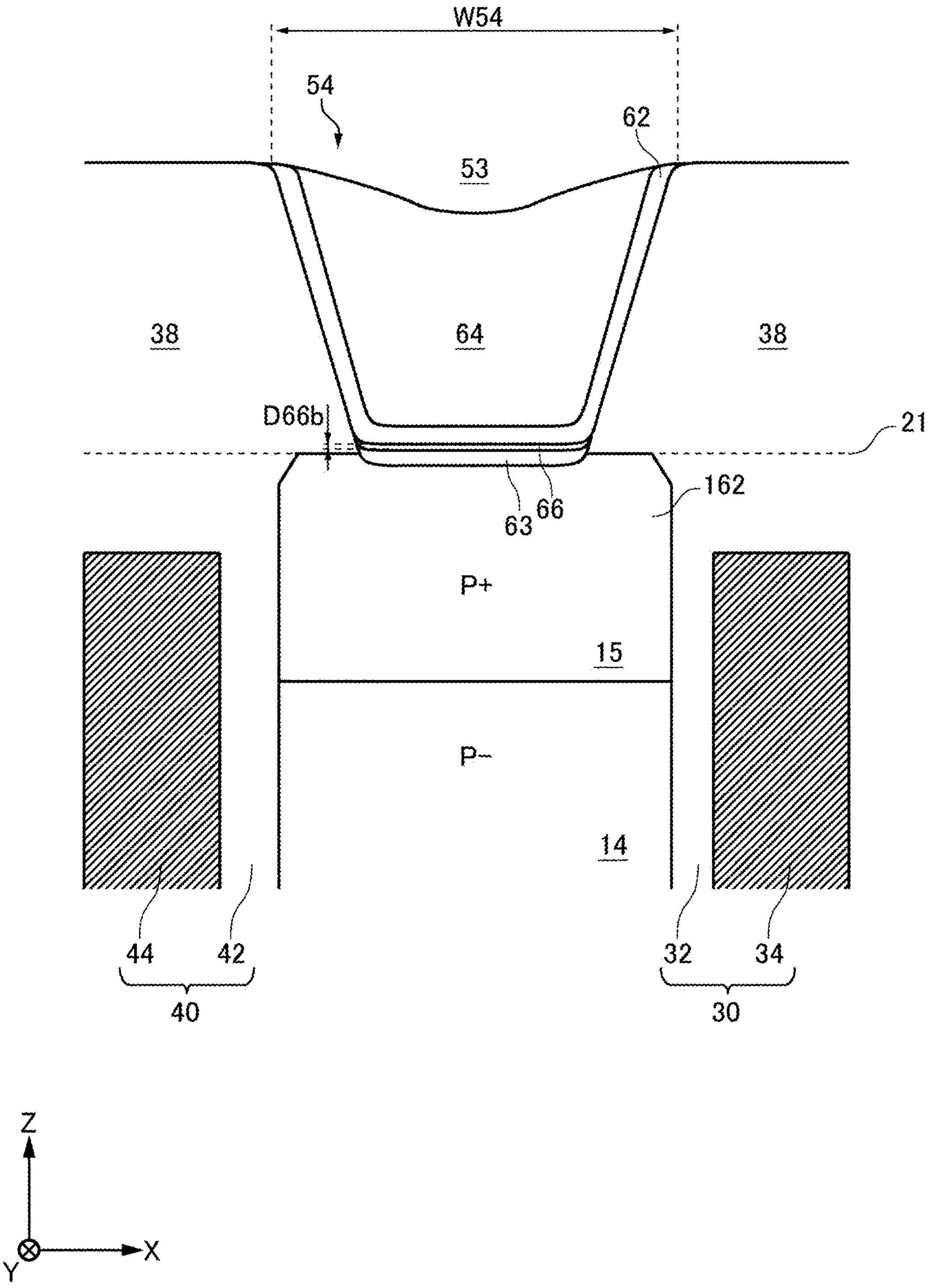
FIG. 6B is an enlarged view of the cross section of the semiconductor device 100.

FIG. 6B is an enlarged view of the cross section of the semiconductor device 100. The cross section of the present example is different from the cross section of FIG. 6A in that it passes through the contact region 15 in the front surface 21. In the present example, differences from FIG. 6A are described in particular.

The film thickness D66*b* is the thickness of the oxide layer 66 in the depth direction of the semiconductor substrate 10. In particular, the film thickness D66*b* is the thickness of the oxide layer 66 above the second conductivity-type region 162 in the depth direction of the semiconductor substrate 10. The film thickness D66*b* may be thinner than the film thickness of the first alloy layer 63. The film thickness D66*b* of the oxide layer 66 above the second conductivity-type region 162 of the present example is thinner than the film thickness D66*a* of the oxide layer 66 above the first conductivity-type region 161.

The oxide layer 66 may be formed above the first conductivity-type region 161 and the second conductivity-type region 162, and then etched selectively above the second conductivity-type region 162. By using a mask, the oxide layer 66 may be formed separately above the first conductivity-type region 161 and above the second conductivity-type region 162 to provide the oxide layer 66 of different film thickness. Although in the present example, the thickness of the oxide layer 66 above the second conductivity-type region 162 is thinner than the thickness of the oxide layer 66 above the first conductivity-type region 161, the thickness of the oxide layer 66 above the first conductivity-type region 161 may be thinner than the thickness of the oxide layer 66 above the second conductivity-type region 162. In addition, the thickness of the oxide layer 66 above the first conductivity-type region 161 and the thickness of the oxide layer 66 above the second conductivity-type region 162 may be different in any of the examples of FIG. 3A, FIG. 3B, FIG. 4A, FIG. 4B, FIG. 5A and FIG. 5B.

Figure 7A:
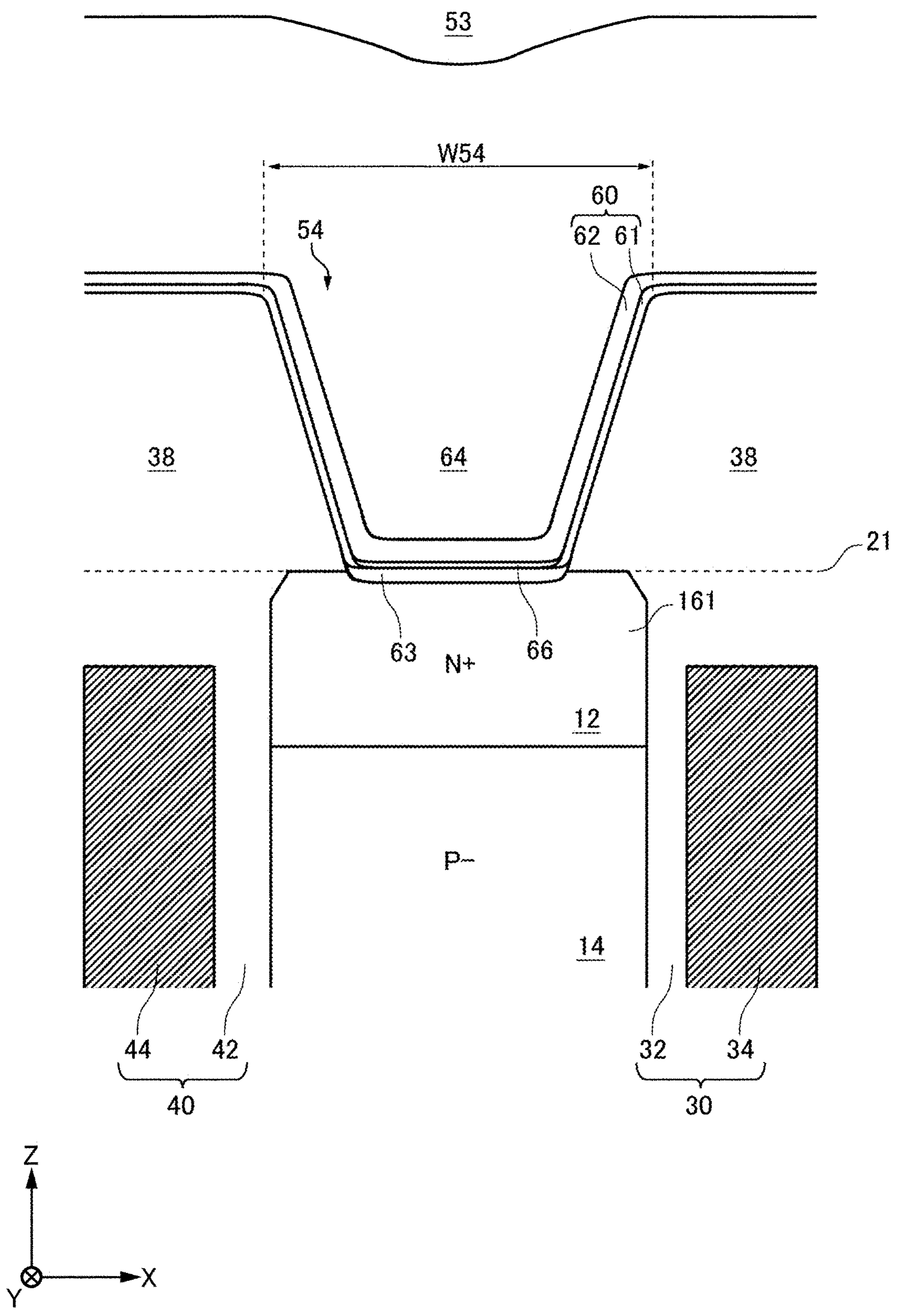
FIG. 7A is an enlarged view of the cross section of the semiconductor device 100.

FIG. 7A is an enlarged view of the cross section of the semiconductor device 100. The cross section of the present example is an X-Z cross section that passes through the emitter region 12 in the front surface 21 of the semiconductor substrate 10. The semiconductor device 100 of the present example is different from the example of FIG. 3A in that the barrier metal layer 60 and the plug layer 64 are provided above the interlayer dielectric film 38 outside the contact hole 54.

The barrier metal layer 60 may be provided in contact with the upper surface of the interlayer dielectric film 38 outside the contact hole 54. The plug layer 64 may be provided in contact with the second barrier metal portion 62 above the interlayer dielectric film 38 outside the contact hole 54. However, only the barrier metal layer 60 may be provided outside the contact hole 54 and the plug layer 64 may be formed only inside the contact hole 54. By the barrier metal layer 60 and the plug layer 64 being formed on the interlayer dielectric film 38, reliability can be enhanced when wire bonding or resin sealing or the like is implemented. In addition, the first barrier metal portion 61 may not be formed in the barrier metal layer 60 on both the inside and the outside of the contact hole 54, and the metal film 67 may be formed between the barrier metal layer 60 and the interlayer dielectric film 38. As an example, in the barrier metal layer 60, the first barrier metal portion 61 may not be provided and only the second barrier metal portion 62 may be provided on the inside and the outside of the contact hole 54, and the plug layer 64 may be provided only inside the contact hole 54.

Figure 7B:
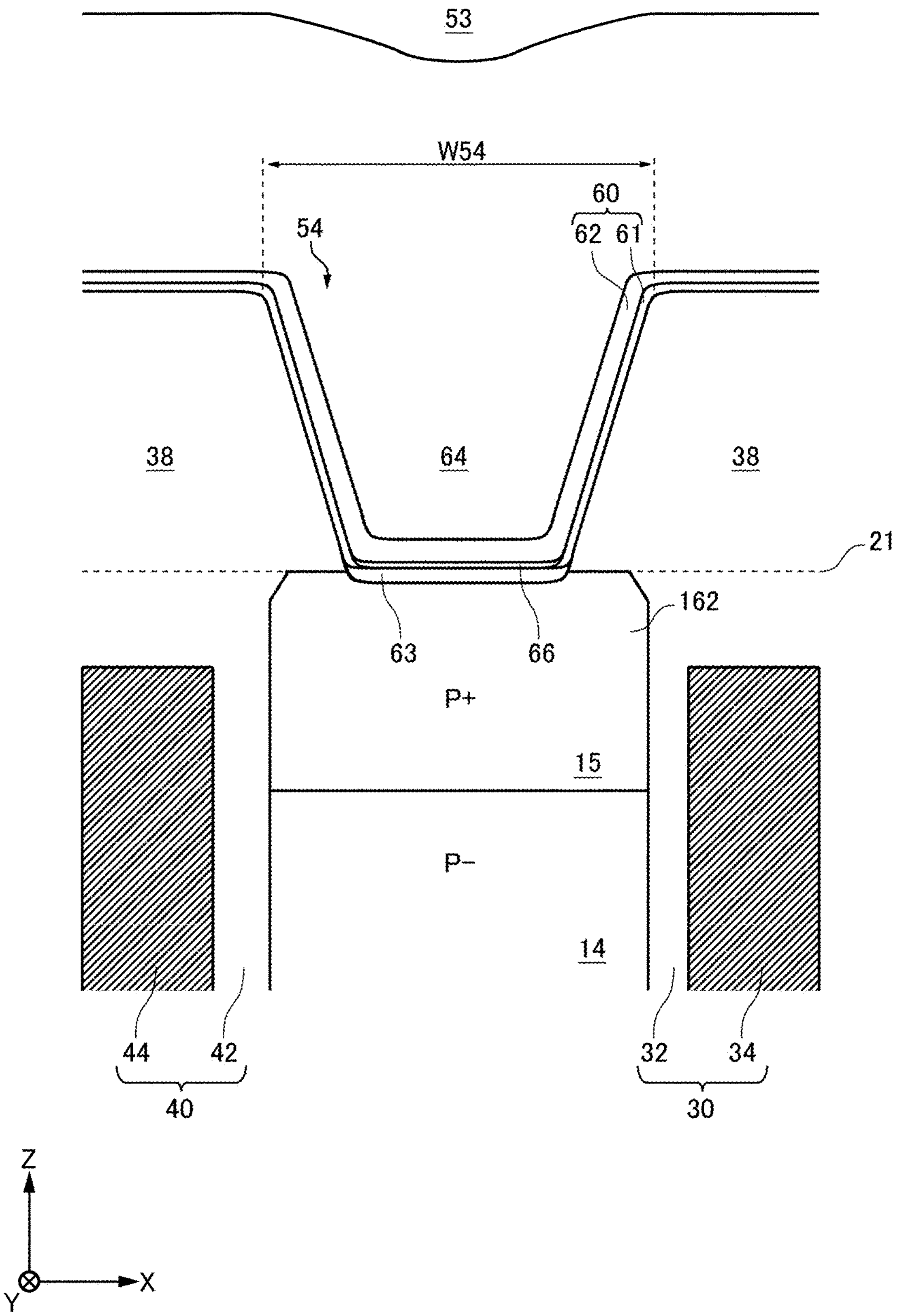
FIG. 7B is an enlarged view of the cross section of the semiconductor device 100.

FIG. 7B is an enlarged view of the cross section of the semiconductor device 100. The cross section of the present example is an X-Z plane that passes through the contact region 15 in the front surface 21 of the semiconductor substrate 10. The semiconductor device 100 of the present example is different from the example of FIG. 3B in that the barrier metal layer 60 and the plug layer 64 are provided above the interlayer dielectric film 38 outside the contact hole 54.

Also in the examples of FIG. 7A and FIG. 7B, by having the oxide layer 66, the semiconductor device 100 can ensure the barrier property during the deposition of the plug layer 64. In addition, by the first barrier metal portion 61 or/and the metal film 67 being removed or becoming thinner due to etching in the process for forming the oxide layer 66, the influence of the hydrogen-absorbing effect can be suppressed and the hydrogen termination of dangling bonds in the MOS gate structure can be promoted. Accordingly, a variation of the threshold voltage can be suppressed.

Figure 8A:
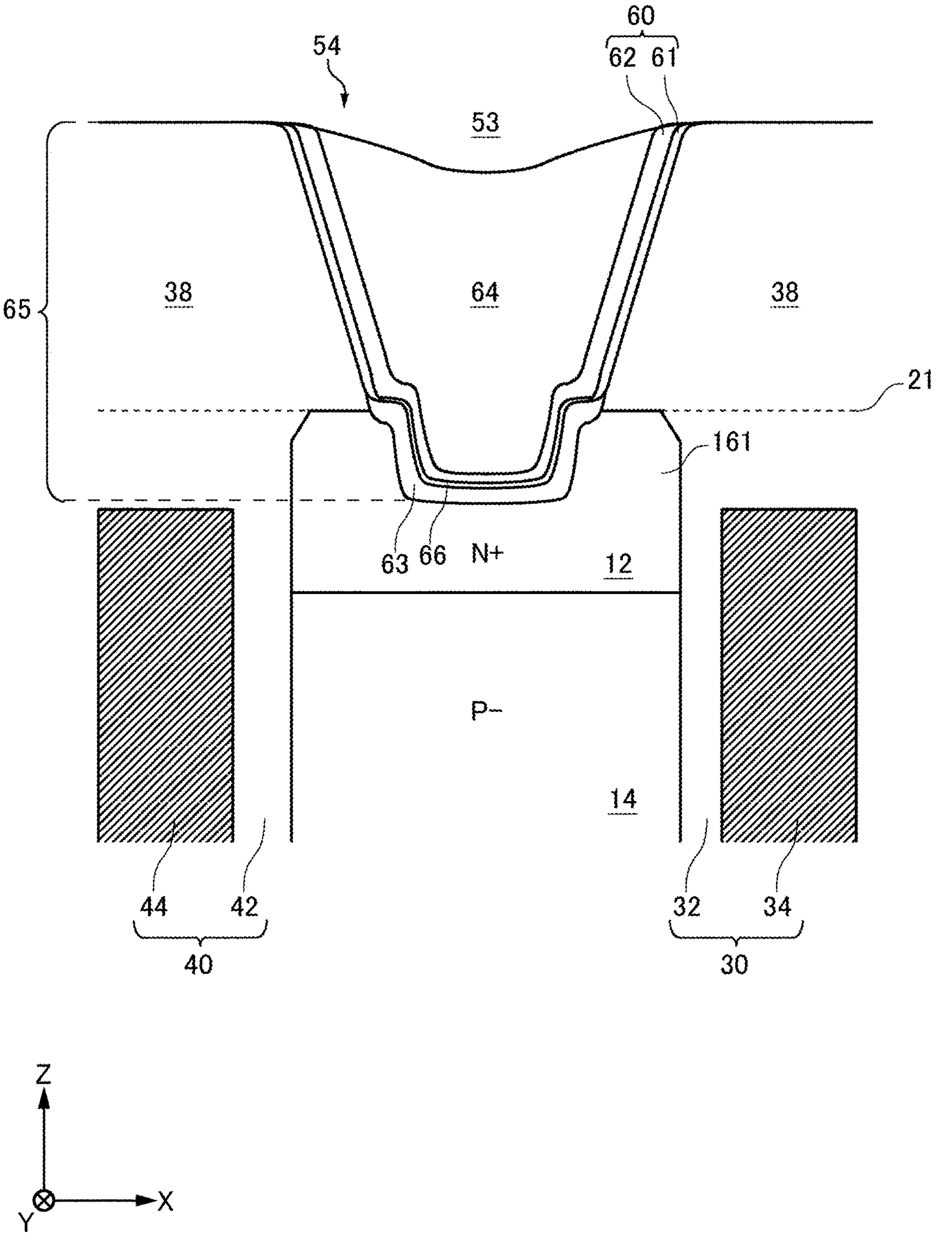
FIG. 8A is an enlarged view of the cross section of the semiconductor device 100.

FIG. 8A is an enlarged view of the cross section of the semiconductor device 100. In the present example, an enlarged view of a cross section in the vicinity of the contact hole 54 is shown. The cross section of the present example is an X-Z cross section that passes through the emitter region 12 in the front surface 21 of the semiconductor substrate 10. The semiconductor device 100 of the present example is different from the example of FIG. 3A in that it includes a trench contact portion 65.

The trench contact portion 65 includes the contact hole 54 and is provided so as to extend from the front surface 21 of the semiconductor substrate 10 in the depth direction of the semiconductor substrate 10. The lower end of the trench contact portion 65 of the present example is shallower than the lower end of the emitter region 12. The lower end of the trench contact portion 65 may be deeper than the lower end of the emitter region 12. The lower end of the trench contact portion 65 of the present example is shallower than the upper end of the gate conductive portion 44. The lower end of the trench contact portion 65 may be deeper than the upper end of the gate conductive portion 44.

The barrier metal layer 60 may include the first barrier metal portion 61 and the second barrier metal portion 62 in the trench contact portion 65. However, the first barrier metal portion 61 may be removed and only the second barrier metal portion 62 may be provided. The first barrier metal portion 61 is provided in contact with the side wall of the interlayer dielectric film 38. The first barrier metal portion 61 may not be provided below the front surface 21. The first alloy layer 63 is provided in contact with the side wall of the semiconductor substrate 10 and with the upper surface of the semiconductor substrate 10 in the trench contact portion 65.

The oxide layer 66 is in contact with the first alloy layer 63. The oxide layer 66 is provided to be stacked on the first alloy layer 63. The oxide layer 66 is provided on the upper surface and a side surface of the first alloy layer 63 in the trench contact portion 65. The oxide layer 66 may be provided entirely on the exposed surface of the first alloy layer 63 during formation of the oxide layer 66.

The barrier metal layer 60 is provided in contact with the oxide layer 66 that is provided on the side wall of the semiconductor substrate 10. The second barrier metal portion 62 of the present example is provided in contact with the first barrier metal portion 61 and the oxide layer 66. The second barrier metal portion 62 is provided to be stacked on the first barrier metal portion 61 that is provided on the side wall of the interlayer dielectric film 38. The plug layer 64 is provided inside the second barrier metal portion 62 in the contact hole 54.

Note that, although the interlayer dielectric film 38 of the present example includes one layer of the dielectric film, a stacked structure in which a plurality of dielectric films are stacked may be included. By providing the trench contact portion 65, the semiconductor device 100 of the present example can have an increased contact area with the semiconductor substrate 10 and a reduced contact resistance. By providing the trench contact portion 65 in the transistor portion 70, extraction of positive holes becomes easy, and latch-up can be suppressed.

Figure 8B:
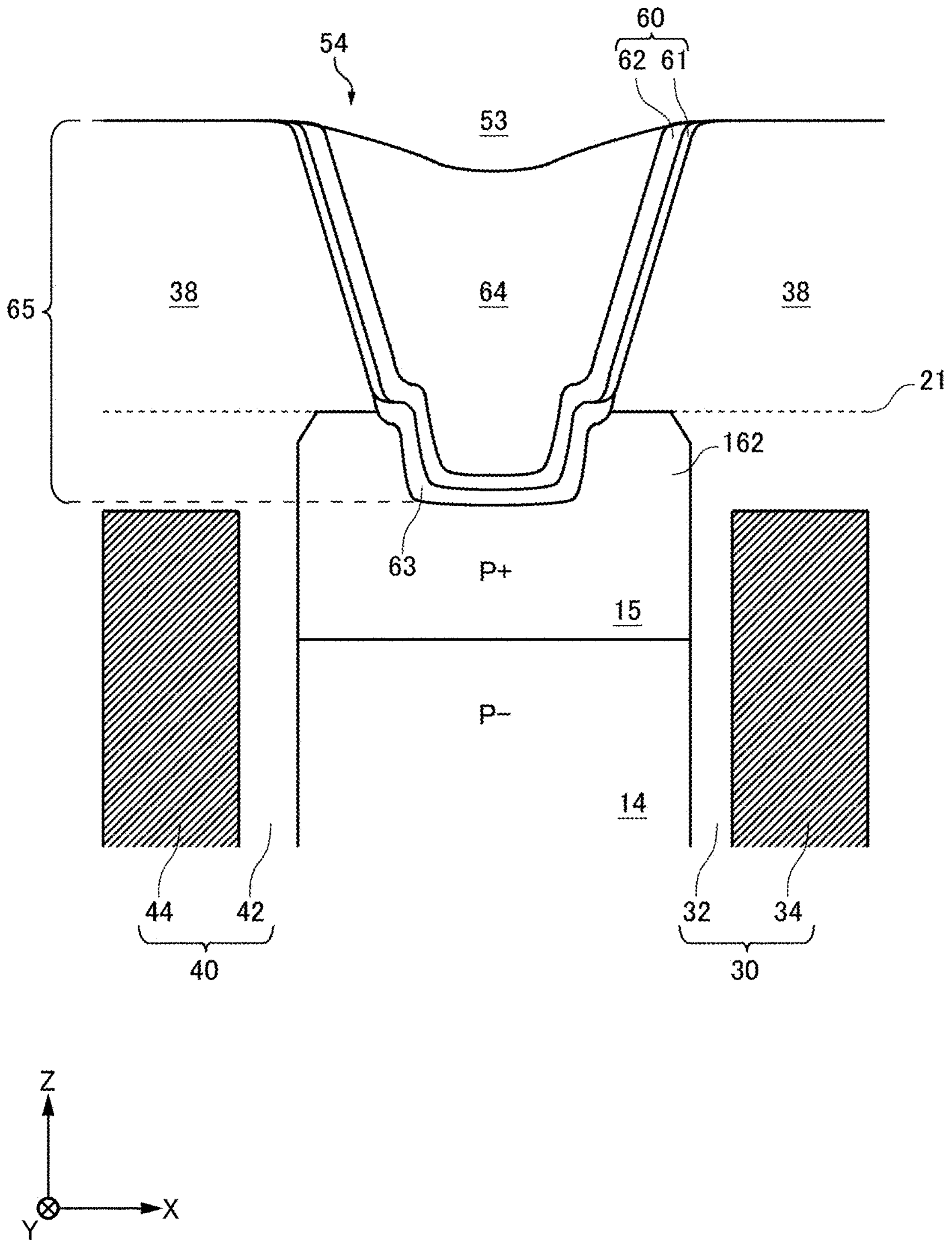
FIG. 8B is an enlarged view of the cross section of the semiconductor device 100.

FIG. 8B is an enlarged view of the cross section of the semiconductor device 100. The cross section of the present example is different from the cross section of FIG. 8A in that it passes through the contact region 15 in the front surface 21. In the present example, differences from FIG. 8A are described in particular.

The oxide layer 66 is provided above the first conductivity-type region 161 and not provided above the second conductivity-type region 162. That is, the oxide layer 66 may not be provided above the contact region 15. The oxide layer 66 may be formed above the first conductivity-type region 161 and the second conductivity-type region 162, and then removed selectively above the second conductivity-type region 162. By using a mask, the oxide layer 66 may be formed only above the first conductivity-type region 161 and may not be formed above the second conductivity-type region 162.

In the semiconductor device 100 of the present example, by the oxide layer 66 above the contact region 15 being removed, extraction of a positive hole can be improved and latch-up can be easily suppressed. In the semiconductor device 100, by the oxide layer 66 being provided above the emitter region 12, the damage caused during formation of the plug layer 64 can be reduced.

Although in the present example, the oxide layer 66 is omitted above the second conductivity-type region 162 in the semiconductor device 100 provided with the trench contact portion 65, the oxide layer 66 may similarly be omitted in the semiconductor device 100 that is not provided with the trench contact portions 65. That is, the oxide layer 66 may be omitted in any of the examples of FIG. 3A, FIG. 3B, FIG. 4A, FIG. 4B, FIG. 5A, FIG. 5B, FIG. 6A, FIG. 6B, FIG. 7A, and FIG. 7B. In addition, although in the present example, the oxide layer 66 above the second conductivity-type region 162 is omitted, the oxide layer 66 above the first conductivity-type region 161 may be omitted. In addition, again in the present example, the thickness of the oxide layer 66 above the first conductivity-type region 161 may be the same as or different from the thickness of the oxide layer 66 above the second conductivity-type region 162.

Figure 9A:
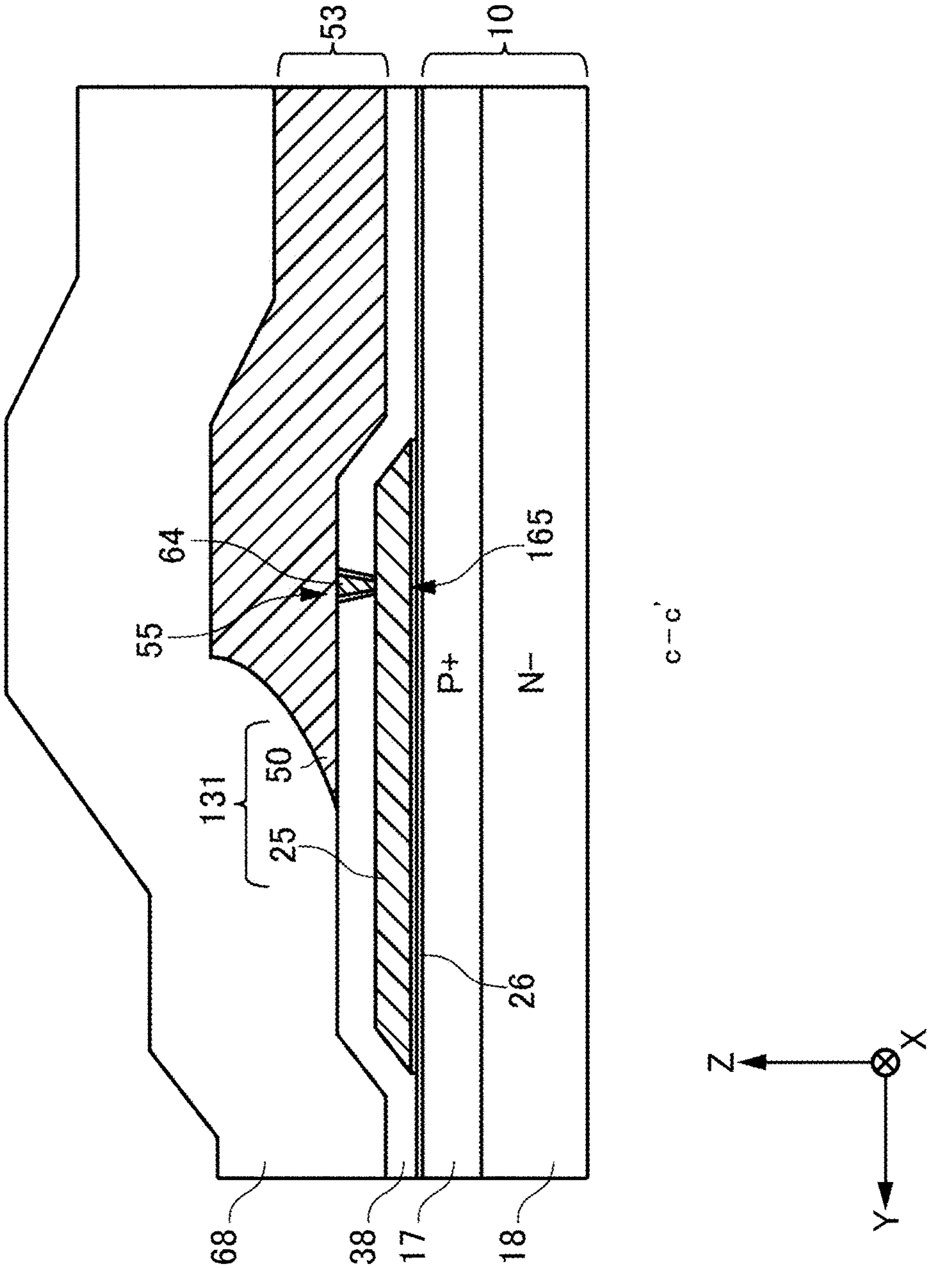
FIG. 9A illustrates an example of a cross section c-c' in FIG. 1A or FIG. 2B.

FIG. 9A illustrates an example of a cross section c-c' in FIG. 1A or FIG. 2B. The cross section c-c' is the Y-Z plane that passes through the inter-active-portion gate runner 131. The inter-active-portion gate runner 131 of the present example includes a gate metal layer 50 and a connection portion 25. The gate metal layer 50 is an example of the front-surface-side metal layer 53. The connection portion 25 is an example of a polycrystalline layer 165. The polycrystalline layer 165 is the polycrystalline layer that is provided above or inside the semiconductor substrate 10, and it may be a semiconductor or may be a metal. The polycrystalline layer 165 of the present example is a polysilicon layer. As another example, when the semiconductor substrate 10 is a silicon carbide substrate, the polycrystalline layer 165 may be a polycrystalline layer that includes silicon carbide; when the semiconductor substrate 10 is a gallium nitride substrate, the polycrystalline layer 165 may be a polycrystalline layer that includes gallium nitride; and when the semiconductor substrate 10 is a diamond substrate, the polycrystalline layer 165 may be a polycrystalline layer that includes diamond. A covering layer 68 such as polyimide may be provided above the inter-active-portion gate runner 131.

The polycrystalline layer 165 may be provided above the semiconductor substrate 10 with a dielectric film 26 interposed therebetween. The polycrystalline layer 165 is electrically connected to the gate conductive portion 44. Note that, the polycrystalline layer 165 may be omitted, and only the front-surface-side metal layer 53 may function as the inter-active-portion gate runner 131. In addition, the front-surface-side metal layer 53 above the polycrystalline layer 165 may be omitted, and only the polycrystalline layer 165 may function as the inter-active-portion gate runner 131. Note that, although in the present example, the cross section of the inter-active-portion gate runner 131 is described, the front-surface-side metal layer 53 and the polycrystalline layer 165 may similarly be provided in the outer circumferential gate runner 130.

A front-surface-side metal layer 53 is provided above the semiconductor substrate 10. A part of the front-surface-side metal layer 53 may be provided to overlap the polycrystalline layer 165 in the depth direction of the semiconductor substrate 10. The front-surface-side metal layer 53 of the present example is electrically connected to the polycrystalline layer 165 through the contact hole 55 provided above the polycrystalline layer 165. The front-surface-side metal layer 53 may be formed of materials that are the same as the emitter electrode 52, or may be of different materials from the emitter electrode 52.

The contact hole 55 may be provided with the barrier metal layer 60, the first alloy layer 63, the plug layer 64, and the oxide layer 66. The contact hole 55 may be provided with the barrier metal layer 60, the first alloy layer 63, the plug layer 64, and the oxide layer 66, as disclosed in any of the examples of FIG. 3A, FIG. 3B, FIG. 4A, FIG. 4B, FIG. 5A, FIG. 5B, FIG. 6A, FIG. 6B, FIG. 7A, FIG. 7B, or FIG. 8A. The contact hole 55 may be provided with the metal film 67, as disclosed in any of the examples of FIG. 4A, FIG. 4B, FIG. 5A, or FIG. 5B. The contact hole 55 may not be provided with the oxide layer 66, as disclosed in the example of FIG. 8B.

The film thickness of the oxide layer 66 may be thinner above the polycrystalline layer 165 than above the first alloy layer 63 on the semiconductor substrate 10, and the mesa portion 71, 81, 91. The oxide layer 66 may be omitted in the contact hole 55 provided above the polycrystalline layer 165. The film thickness of the oxide layer 66 may be thicker above the polycrystalline layer 165 than above the first alloy layer 63 on the semiconductor substrate 10, and the mesa portion 71, 81, 91. The oxide layer 66 may be provided in the contact hole 55 that is provided above the polycrystalline layer 165, and may be omitted above the first alloy layer 63 on the semiconductor substrate 10 and the mesa portion 71, 81, 91. By changing the film thickness of the oxide layer 66 above the polycrystalline layer 165, the magnitude of the gate resistance of the semiconductor device 100 can be adjusted. In addition, an adjustment may be made regarding whether to provide the oxide layer 66 above the polycrystalline layer 165, according to the magnitude of the gate resistance of the semiconductor device 100. By changing the area of the contact hole 55, in addition to changing the film thickness of the oxide layer 66, the magnitude of the gate resistance of the semiconductor device 100 may be adjusted. The magnitude of the gate resistance of the semiconductor device 100 may also be adjusted by providing a resistive layer instead of the oxide layer 66.

Note that, the contact hole 55 may be provided in the inter-active-portion gate runner 131. That is, the contact hole 55 may function as the contact hole to connect the front-surface-side metal layer 53 provided on the inter-active-portion gate runner 131 and the polycrystalline layer 165. The magnitude of the gate resistance may also be adjusted in the inter-active-portion gate runner 131, according to the size of the film thickness of the oxide layer 66, the presence or absence of the oxide layer 66, the presence or absence of the resistive layer, and the area of the contact hole 55.

Figure 9B:
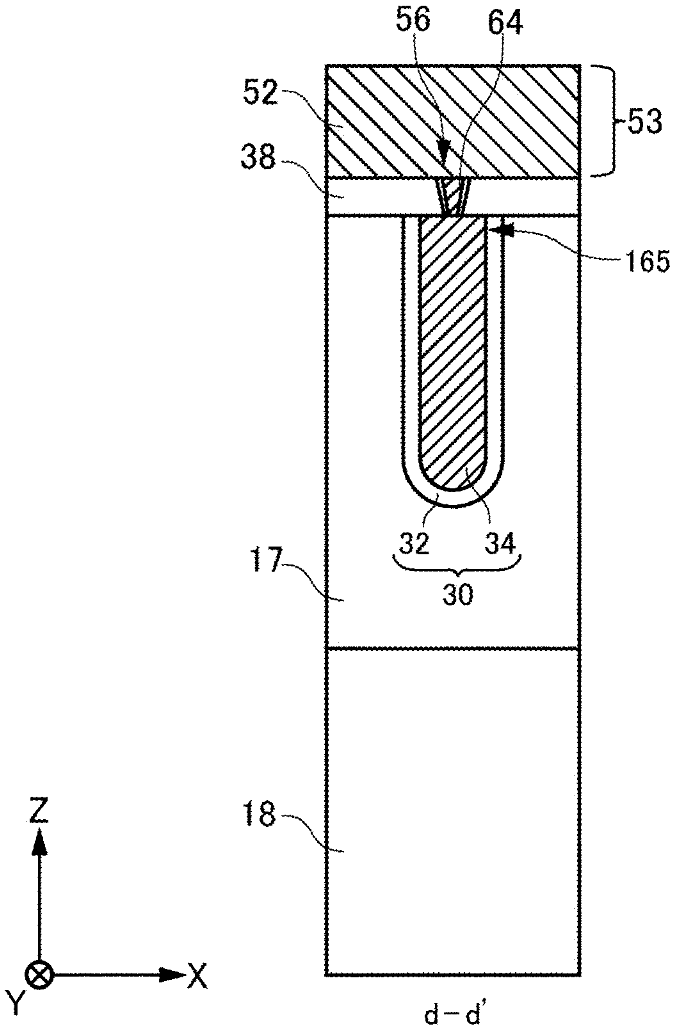
FIG. 9B illustrates an example of a cross section d-d' in FIG. 1A or FIG. 2B.

FIG. 9B illustrates an example of a cross section d-d' in FIG. 1A or FIG. 2B. The cross section d-d' is an X-Z plane that passes through the dummy trench portion 30.

The polycrystalline layer 165 may be provided in the semiconductor substrate 10. The dummy conductive portion 34 of the present example is an example of the polycrystalline layer 165 provided in the semiconductor substrate 10. The contact hole 56 may be provided above the dummy conductive portion 34. The contact hole 56 functions as the contact hole to connect the emitter electrode 52 and the polycrystalline layer 165. The emitter electrode 52 is an example of the front-surface-side metal layer 53. In the present example, the presence or absence of the oxide layer 66, the size of the film thickness of the oxide layer 66, and the area of the contact hole 56 may be adjusted as appropriate.

The contact hole 56 may be provided with the barrier metal layer 60, the first alloy layer 63, the plug layer 64, and the oxide layer 66. The contact hole 56 may be provided with the barrier metal layer 60, the first alloy layer 63, the plug layer 64, and the oxide layer 66, as disclosed in any of the examples of FIG. 3A, FIG. 3B, FIG. 4A, FIG. 4B, FIG. 5A, FIG. 5B, FIG. 6A, FIG. 6B, FIG. 7A, FIG. 7B, or FIG. 8A. The contact hole 56 may be provided with the metal film 67, as disclosed in any of the examples of FIG. 4A, FIG. 4B, FIG. 5A, or FIG. 5B. The contact hole 56 may not be provided with the oxide layer 66, as disclosed in the example of FIG. 8B. In FIG. 1A, FIG. 2B, FIG. 9A, and FIG. 9B, the gate conductive portion 44 and the front-surface-side metal layer 53 are connected through the connection portion 25 and the contact hole 55, and the dummy conductive portion 34 and the emitter electrode 52 are connected through the contact hole 56. The gate conductive portion 44 and the front-surface-side metal layer 53 may be connected through the contact hole 55, and the dummy conductive portion 34 and the emitter electrode 52 may be connected through the connection portion 25 and the contact hole 56.

Figure 10A:
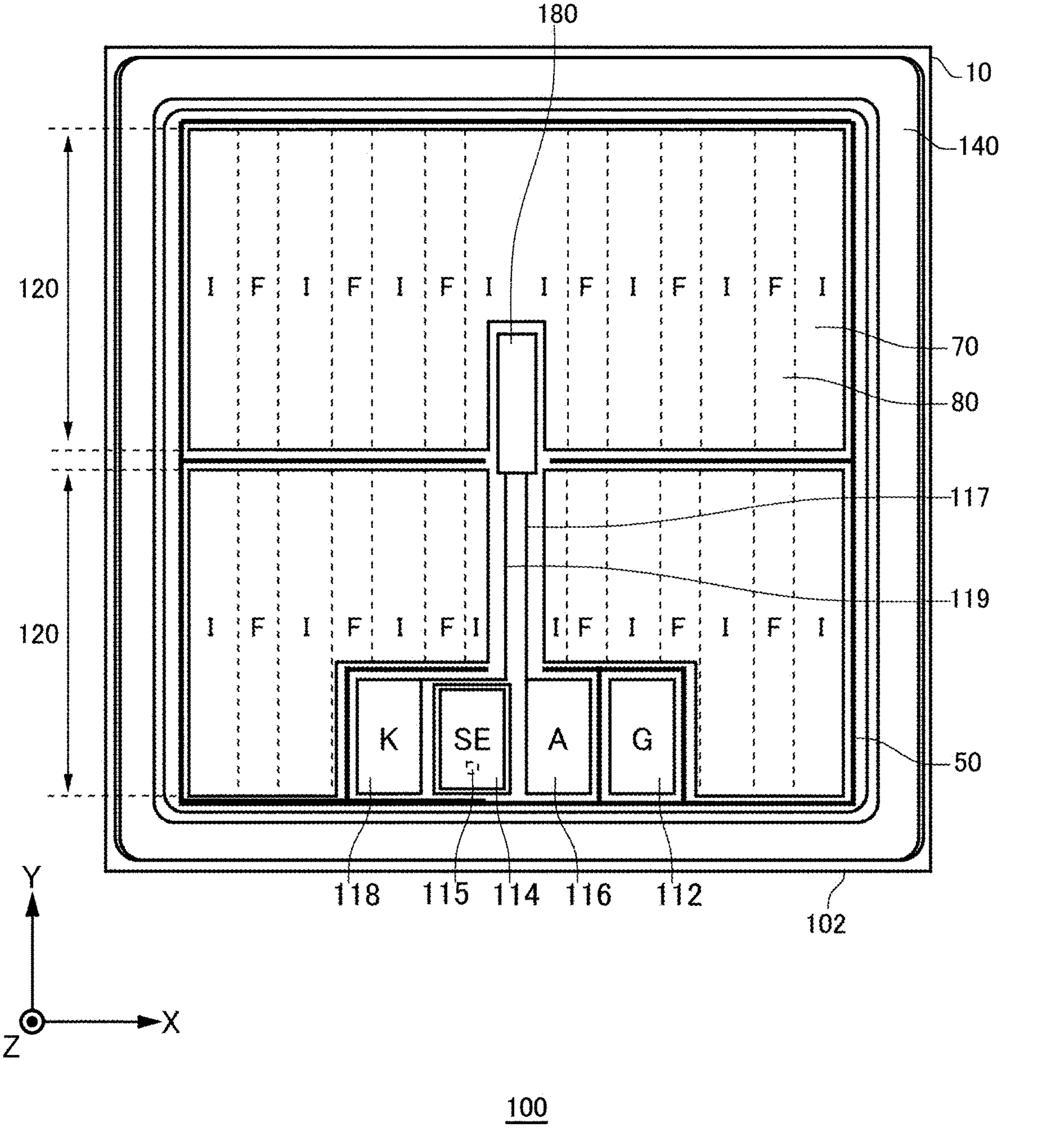
FIG. 10A illustrates an example of a top view of the semiconductor device 100 provided with a temperature-sensing portion 180.

FIG. 10A illustrates an example of a top view of the semiconductor device 100 provided with a temperature-sensing portion 180. The semiconductor device 100 of the present example includes a gate pad 112, a sensing electrode 114, an anode pad 116, and a cathode pad 118.

The front-surface-side metal layer 53 may include the gate pad 112, the sensing electrode 114, the anode pad 116, and the cathode pad 118. The front-surface-side metal layer 53 may be electrically connected to a conductive member such as a leadframe. The front-surface-side metal layer 53 may be electrically connected to an electrode external to the semiconductor device 100 by wire bonding or the like. Note that, the number and position of the front-surface-side metal layer 53 are not limited to the present example.

The sensing electrode 114 is electrically connected to a current sensing portion 115 provided below the sensing electrode 114. The sensing electrode 114 detects current flowing through the current sensing portion 115. The current sensing portion 115 detects current flowing through the transistor portion 70. The current sensing portion 115 has a structure corresponding to the transistor portion 70 and simulates the operation of the transistor portion 70, allowing the current, which is proportional to the current flowing through the transistor portion 70, to flow. By using the current sensing portion 115, the current flowing through the transistor portion 70 can be monitored.

The temperature-sensing portion 180 is provided on or inside the semiconductor substrate 10. The temperature-sensing portion 180 of the present example is provided on a well region 17 between the transistor portions 70 in the middle of the semiconductor device 100. The temperature-sensing portion 180 senses the temperature of the active portion 120. The temperature-sensing portion 180 may include a diode formed of monocrystalline or polycrystalline silicon. The temperature-sensing portion 180 is used for detecting the temperature of the semiconductor device 100 and protecting a semiconductor chip from overheating. The temperature-sensing portion 180 is connected to a constant current source. When the temperature of the semiconductor device 100 varies, the forward voltage of a current flowing in the temperature-sensing portion 180 varies. The semiconductor device 100 can detect the temperature based on the variation of the forward voltage of the temperature-sensing portion 180. The temperature-sensing portion 180 has its long side along the Y-axis direction and its short side along the X-axis direction, although they are not limited to this.

The anode pad 116 is electrically connected to an anode region of the temperature-sensing portion 180. The anode pad 116 is electrically connected to the anode region in the temperature-sensing portion 180 by anode wiring 117.

The cathode pad 118 is electrically connected to a cathode region of the temperature-sensing portion 180. The cathode pad 118 is electrically connected to the cathode region in the temperature-sensing portion 180 by cathode wiring 119.

Figure 10B:
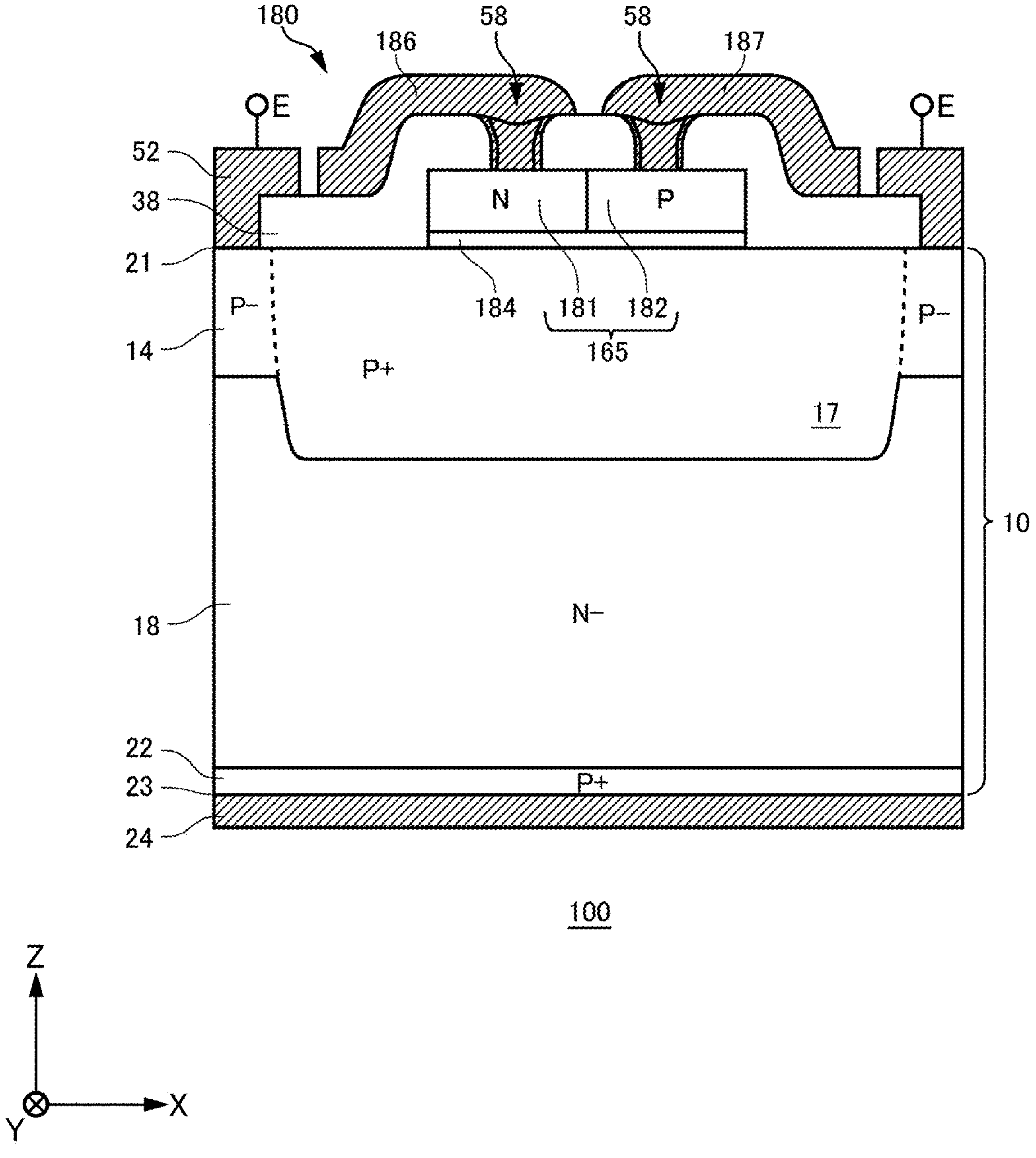
FIG. 10B is an example of an enlarged view of the cross section in the temperature-sensing portion 180.

FIG. 10B is an example of an enlarged view of the cross section in the temperature-sensing portion 180. The temperature-sensing portion 180 of the present example includes the contact hole 58, although any structure of the contact hole in other examples may be adopted.

The temperature-sensing portion 180 includes the diode provided in the semiconductor substrate 10. The temperature-sensing portion 180 utilizes a current-voltage characteristic of the diode, which varies according to the temperature, to detect the temperature of the semiconductor device 100. The temperature-sensing portion 180 is arranged above the semiconductor substrate 10 with the interlayer dielectric film 184 interposed therebetween. The interlayer dielectric film 184 may be a HTO film. The temperature-sensing portion 180 may be provided above the well region 17. The temperature-sensing portion 180 of the present example includes a cathode region 181, an anode region 182, the interlayer dielectric film 184, a cathode electrode 186 and an anode electrode 187.

The cathode region 181 and the anode region 182 constitute a PN diode. For example, the cathode region 181 is formed of an N-type semiconductor and functions as the cathode of the PN diode. The anode region 182 is formed of a P-type semiconductor and functions as the anode of the PN diode. The cathode region 181 and the anode region 182 are provided on the interlayer dielectric film 184. The material of the cathode region 181 and the anode region 182 may be polysilicon.

The cathode region 181 and the anode region 182 are examples of the polycrystalline layer 165. That is, in the contact hole 58, the oxide layer 66 may or may not be provided above the cathode region 181 and the anode region 182. The oxide layer 66 may only be provided above either one of the cathode region 181 or the anode region 182. For example, the oxide layer 66 may be provided above the cathode region 181, and no oxide layer 66 may be provided above the anode region 182. On the contrary, the oxide layer 66 may be provided above the anode region 182 and no oxide layer 66 may be provided above the cathode region 181. Determination to form or not to form the oxide layer 66 may be made in consideration of resistance so that the stability of the temperature-sensing portion 180 is not lost.

The cathode electrode 186 is electrically connected to the cathode region 181 through the contact hole 58. The cathode electrode 186 is an example of the front-surface-side metal layer 53. That is, the cathode electrode 186 may be formed of the same material as the emitter electrode 52. The cathode electrode 186 is electrically connected to the cathode pad 118 by the cathode wiring 119.

The anode electrode 187 is electrically connected to the anode region 182 through the contact hole 58. The anode electrode 187 is an example of the front-surface-side metal layer 53. That is, the anode electrode 187 may be formed of the same material as the emitter electrode 52. The anode electrode 187 is electrically connected to the anode pad 116 by the anode wiring 117.

The interlayer dielectric film 38 is provided on the upper surface of the cathode region 181 and the anode region 182. The contact hole 58 may be formed in the interlayer dielectric film 38 of the temperature-sensing portion 180.

An element region such as the transistor portion 70 and the diode portion 80 may be provided below the temperature-sensing portion 180. The collector region 22 is provided below the temperature-sensing portion 180 of the present example. That is, the temperature-sensing portion 180 of the present example is provided on the transistor portion 70. However, the temperature-sensing portion 180 may be provided on the diode portion 80, or may be provided in the vicinity of the edge termination structure portion 140, which is a region away from the active portion 120. Accordingly, the high concentration region such as the collector region 22 may not be formed below the temperature-sensing portion 180.

Figure 11:
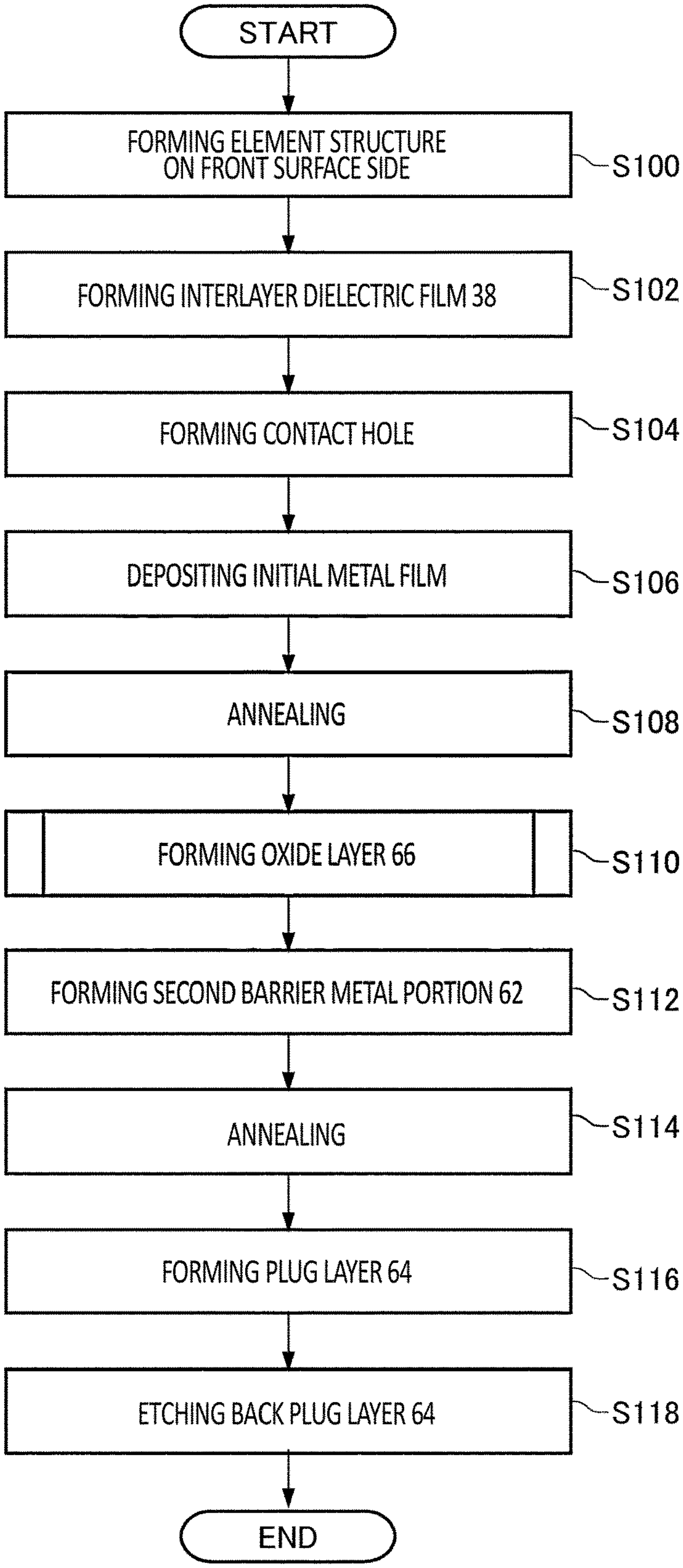
FIG. 11 is a flowchart illustrating an example of a manufacturing process of the semiconductor device 100.

FIG. 11 is a flowchart illustrating an example of a manufacturing process of the semiconductor device 100. In step S100, an element structure on the front surface 21 side of the semiconductor device 100 is formed. Step S100 may include a process of forming the dummy trench portion 30 and the gate trench portion 40 as the element structure on the front surface 21 side. Step S100 may include a process of forming, as the element structure on the front surface 21 side, the base region 14, the emitter region 12, the contact region 15, and the like by performing ion implantation with respect to the semiconductor substrate 10.

In step S102, the interlayer dielectric film 38 is formed above the semiconductor substrate 10. The interlayer dielectric film 38 may be formed by stacking a plurality of dielectric films. In step S104, the interlayer dielectric film 38 is etched to form contact holes. In step S104, contact holes such as the contact hole 54, the contact hole 55, the contact hole 56, and the contact hole 58 may be formed in the interlayer dielectric film 38.

In step S106, an initial metal film is deposited to form the first alloy layer 63. In the present example, a predetermined initial metal film is formed on the side walls of the interlayer dielectric film 38 and on the upper surface of the semiconductor substrate 10 in the contact hole 54. That is, the initial metal film is formed so as to be in contact with the interlayer dielectric film 38 and the semiconductor substrate 10. The initial metal film may be composed of the first metal. By processing the initial metal film, the first alloy layer 63 may be formed. For example, the initial metal film is a Ti film deposited by sputtering. The film thickness of the initial metal film may be 1 nm or more and 100 nm or less. In addition, by processing the initial metal film, the first barrier metal portion 61 and the oxide layer 66 may be formed.

In step S108, the semiconductor substrate 10 is annealed in a nitrogen atmosphere. Thus, the first alloy layer 63 is formed on the upper surface of the semiconductor substrate 10. In this manner, the initial metal film in contact with the semiconductor substrate 10 becomes the first alloy layer 63. The first alloy layer 63 of the present example is a titanium silicide film formed by annealing the Ti film on the upper surface of the semiconductor substrate 10. An annealing temperature may be 300° C. or more and 1100° C. or less. The annealing to form the first alloy layer 63 may be performed before the second barrier metal portion 62 is formed. In addition, in step S 108, the first barrier metal portion 61 may be formed on the side wall of the interlayer dielectric film 38. The initial metal film in contact with the interlayer dielectric film 38 may become the first barrier metal portion 61. The first barrier metal portion 61 of the present example is a dense TIN film formed by annealing the Ti film on the side wall of the interlayer dielectric film 38. Although in the present example, the formation of TiN film as the first barrier metal portion 61 is described, the initial metal film of different materials may be deposited if the material of the first barrier metal portion 61 is not TiN. Note that, there may remain unreacted metal film 67 of the first metal between the interlayer dielectric film 38 and the first barrier metal portion 61.

In step S110, the oxide layer 66 is formed after the first alloy layer 63 is formed on the upper surface of the semiconductor substrate 10. The oxide layer 66 may be formed before the second barrier metal portion 62 is formed. The oxide layer 66 is formed on the upper surface of the first alloy layer 63 in the contact hole 54. The oxide layer 66 may be formed entirely on the exposed surface of the first alloy layer 63 in the contact hole 54. The step to form the oxide layer 66 may include wet etching, dry etching, annealing, or depositing. The specific method of forming the oxide layer 66 will be described below.

When the oxide layer 66 is formed by etching, the first barrier metal portion 61 and/or the metal film 67 may be etched in the process to form the oxide layer 66. Thus, an adjustment may be made so that the first barrier metal portion 61 and/or the metal film 67 become a predetermined film thickness. The first barrier metal portion 61 may be etched to have a film thickness of 1 nm or more and 10 nm or less. The first barrier metal portion 61 and/or the metal film 67 may entirely be removed by etching.

In step S112, the second barrier metal portion 62 is formed. The second barrier metal portion 62 may be formed to be stacked on the oxide layer 66 below the contact hole 54. When the oxide layer 66 is not formed, the second barrier metal portion 62 may be formed to be stacked on the first alloy layer 63. The second barrier metal portion 62 may be formed to be stacked on the first barrier metal portion 61 and/or the metal film 67 on the side wall of the contact hole 54. When the first barrier metal portion 61 and/or the metal film 67 are entirely removed, the second barrier metal portion 62 may be formed in contact with the interlayer dielectric film 38 on the side wall of the contact hole 54. The second barrier metal portion 62 of the present example is a TiN film formed by sputtering.

In step S114, the semiconductor substrate 10 is annealed in a nitrogen atmosphere. An annealing condition in step S114 may be the same as or different from the annealing condition in step S108. The annealing of the present example is performed after the second barrier metal portion 62 is formed. The annealing of the second barrier metal portion 62 may be performed before the plug layer 64 is formed.

In step S116, the plug layer 64 is formed. In the present example, tungsten is formed so as to fill inside the contact hole 54 by a CVD (chemical vapor deposition) method.

The oxide layer 66 of the present example is provided on the upper surface of the first alloy layer 63 and may function as the metal-diffusion-prevention layer during the formation of the plug layer 64. By providing the oxide layer 66, penetration of the plug layer 64 into the first alloy layer 63 can be prevented when the plug layer 64 is formed by CVD.

In step S118, the plug layer 64 is etched back. Accordingly, an unnecessary tungsten film outside the contact hole 54 may be removed. Etching back may be performed by dry etching or chemical mechanical polishing (CMP). When the tungsten film is removed, the metal film 67, the first barrier metal portion 61, and the second barrier metal portion 62 on the interlayer dielectric film 38 may also be removed. The metal film 67, the first barrier metal portion 61, and the second barrier metal portion 62 on the interlayer dielectric film 38 may be removed in a process different from the process to etch back the plug layer 64. The metal film 67, the first barrier metal portion 61, and the second barrier metal portion 62 on the interlayer dielectric film 38 may not be removed. Note that, step S118 may be omitted and the plug layer 64 may remain on the outside of the contact hole 54.

After step S118, the front-surface-side metal layer 53 may be formed above the semiconductor substrate 10. In addition, after step S118, the members on the back surface 23 side such as the collector electrode 24 may be formed. After step S118, the back surface side lifetime control region 151 and the front-surface-side lifetime control region 152 may be formed.

Figure 12A:
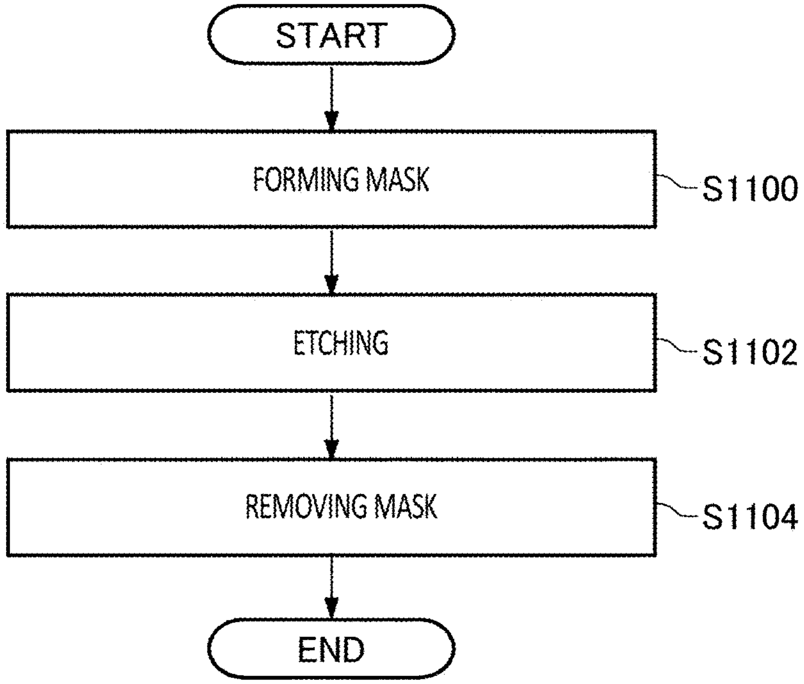
FIG. 12A illustrates an example of a formation process of an oxide layer 66.

FIG. 12A illustrates an example of a formation process of the oxide layer 66. In the present example, a method to form the oxide layer 66 by etching will be described. Step S1100 to step S1104 are examples of step S110 of FIG. 11.

In step S1100, a mask is formed above the semiconductor substrate 10. For example, the mask is formed on a region that is to be protected from etching. The mask may be formed on one of the first conductivity-type region 161 or the second conductivity-type region 162, and may not be formed on another. The mask may be formed above the contact region 15, and may not be formed above the emitter region 12. When the oxide layer 66 is not formed above the polycrystalline layer 165, the mask may be formed on the contact hole 58 above the polycrystalline layer 165.

In step S1102, the upper surface of the first alloy layer 63 is etched. In the present example, wet etching is performed on the upper surface of the first alloy layer 63, although dry etching may be performed. Wet etching of the upper surface of the first alloy layer 63 may include wet etching it using hydrogen peroxide. Wet etching allows the upper surface of the first alloy layer 63 to be etched as well as to be oxidized. By oxidizing the upper surface of the first alloy layer 63, the oxide layer 66 may be formed. A chemical liquid for wet etching may be hydrogen peroxide, buffered hydrofluoric acid, or other chemical liquid such as hydrofluoric acid or ammonium hydroxide. In step S1102, the first barrier metal portion 61 may be etched.

In step S1104, the mask provided above the semiconductor substrate 10 is removed. Note that, step S1100 and step S1104 may be omitted. Subsequently, the process proceeds to step S112 of FIG. 11 and the second barrier metal portion 62 may be formed.

Figure 12B:
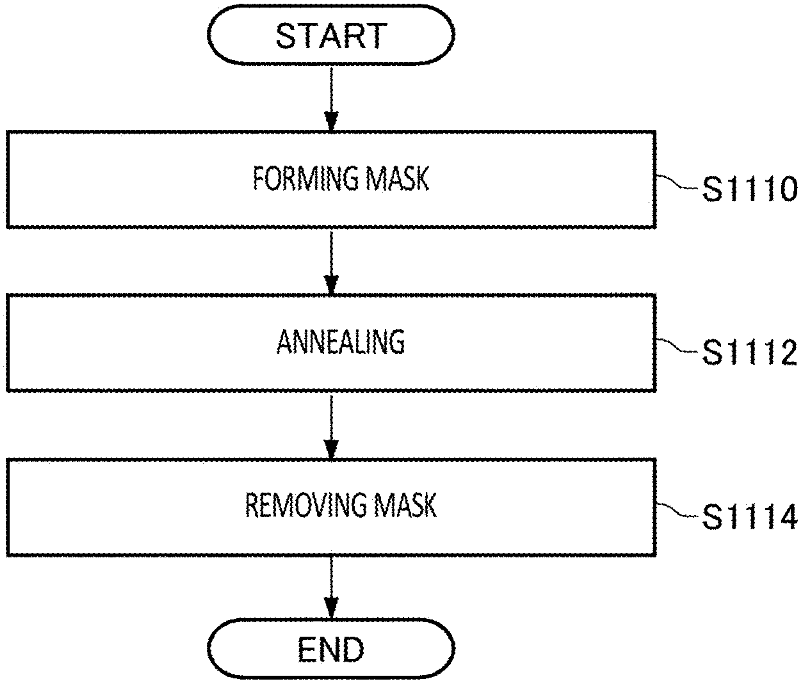
FIG. 12B illustrates a modification example of the formation process of the oxide layer 66.

FIG. 12B illustrates a modification example of the formation process of the oxide layer 66. In the present example, a method to form the oxide layer 66 by annealing will be described. Step S1110 to step S1114 are examples of step S110 of FIG. 11. The present example is different from the example of FIG. 12A in that step S1112 is the annealing step. In the present example, differences from FIG. 12A are described in particular.

In step S1112, the semiconductor substrate 10 is annealed in an oxygen atmosphere. Thus, the oxide layer 66 is formed in a region where no mask is formed on the upper surface of the first alloy layer 63. On the other hand, no oxide layer 66 is formed in a region where the mask is formed on the upper surface of the first alloy layer 63. Note that, step S1110 and step S1114 may also be omitted when the oxide layer 66 is formed by annealing.

Figure 12C:
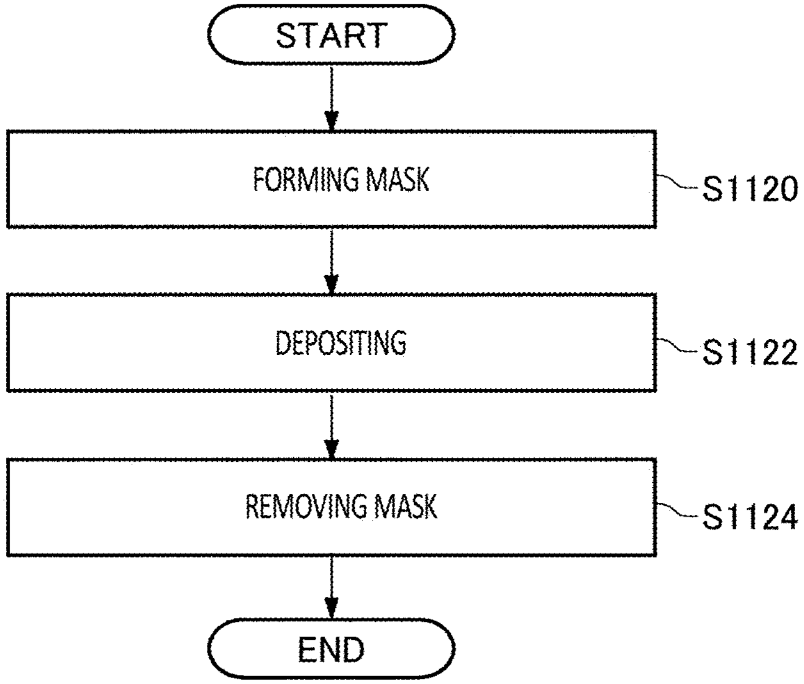
FIG. 12C illustrates a modification example of the formation process of the oxide layer 66.

FIG. 12C illustrates a modification example of the formation process of the oxide layer 66. In the present example, a method to form the oxide layer 66 by deposition will be described. Step S1120 to step S1124 are examples of step S110 of FIG. 11. The present example is different from the example of FIG. 12A in that step S1122 is the deposition step. In the present example, differences from FIG. 12A are described in particular.

In step S1122, the oxide layer 66 is deposited on the semiconductor substrate 10 by CVD, sputtering or the like. For example, the oxide layer 66 may be a low temperature oxide (LTO) film, or an HTO film. Thus, the oxide layer 66 is formed on the upper surface of the first alloy layer 63 in a region where no mask is formed on the upper surface of the first alloy layer 63. On the other hand, the oxide layer 66 is formed on the upper surface of the mask in a region where the mask is formed on the upper surface of the first alloy layer 63. Note that, the oxide layer 66 on the upper surface of the mask may be removed along with the mask when the mask removal in step S1124 is performed. Step S1120 and step S1124 may be omitted also when the oxide layer 66 is formed by deposition.

Figure 13:
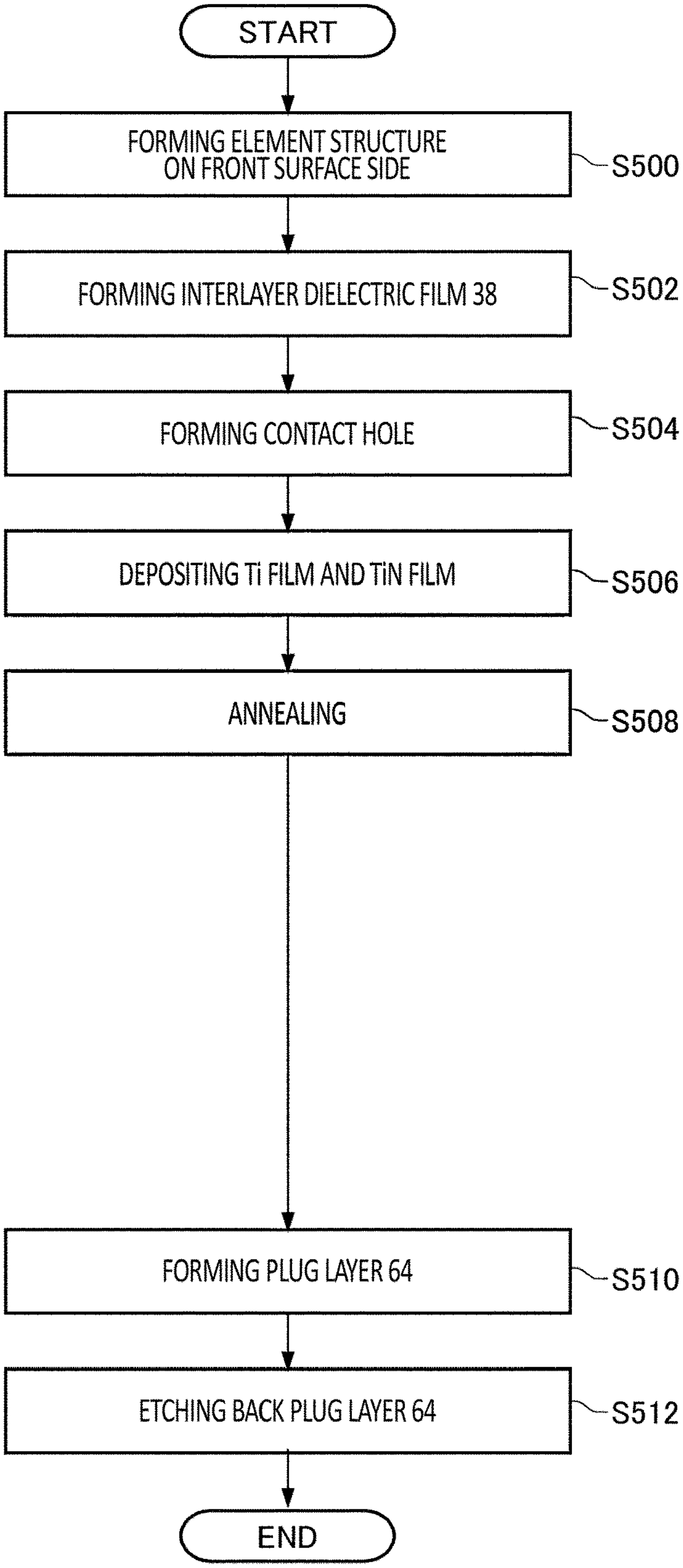
FIG. 13 is a flowchart illustrating a manufacturing process of a semiconductor device according to a comparative example.

FIG. 13 illustrates a flowchart showing manufacturing processes of a semiconductor device according to a comparative example. Step S500 to step S504 may be the same as step S100 to step S104 of FIG. 11, respectively.

In step S506, a Ti film and a TiN film are deposited inside the contact hole. In step S508, a dense TiN film is formed from the Ti film on the side wall of the interlayer dielectric film 38 by annealing the semiconductor substrate 10 in a nitrogen atmosphere. A titanium silicide layer is formed on the upper surface of the semiconductor substrate 10.

In step S510, the plug layer 64 is formed inside the contact hole. In step S512, the plug layer 64 is etched back.

In this manner, in the semiconductor device of the comparative example, the Ti film and the TiN film are collectively deposited, and no oxide layer 66 is formed on the upper surface of the first alloy layer 63. In addition, some Ti film may not be nitrided and the Ti having the hydrogen-absorbing effect may remain.

Meanwhile, in the semiconductor device 100, the first alloy layer 63 can be protected from the damage during deposition of the plug layer 64 by the oxide layer 66 formed on the upper surface of the first alloy layer 63. In addition, the unreacted first metal having the hydrogen-absorbing effect can be removed and defects around the MOS gate structure can be terminated by hydrogen to suppress the variation of the threshold voltage.

While the present invention has been described by way of the embodiments, the technical scope of the present invention is not limited to the above described embodiments. It is apparent to persons skilled in the art that various alterations or improvements can be made to the above described embodiments. It is also apparent from the described scope of the claims that the embodiments added with such alterations or improvements can be included the technical scope of the present invention.

The operations, procedures, steps, stages, or the like of each process performed by a device, system, program, and method shown in the claims, embodiments, or diagrams can be performed in any order as long as the order is not indicated by "prior to," "before," or the like and as long as the output from a previous process is not used in a later process. Even if the operation flow is described using phrases such as "first" or "next" in the claims, embodiments, or diagrams, it does not necessarily mean that the process must be performed in this order.

EXPLANATION OF REFERENCES

10 . . . semiconductor substrate, 12 . . . emitter region, 14 . . . base region, 15 . . . contact region, 16 . . . accumulation region, 17 . . . well region, 18 . . . drift region, 20 . . . buffer region, 21 . . . front surface, 22 . . . collector region, 23 . . . back surface, 24 . . . collector electrode, 25 . . . connection portion, 26 . . . dielectric film, 30 . . . dummy trench portion, 31 . . . extending part, 32 . . . dummy dielectric film, 33 . . . connecting part, 34 . . . dummy conductive portion, 38 . . . interlayer dielectric film, 40 . . . gate trench portion, 41 . . . extending part, 42 . . . gate dielectric film, 43 . . . connecting part, 44 . . . gate conductive portion, 50 . . . gate metal layer, 52 . . . emitter electrode, 53 . . . front-surface-side metal layer, 54 . . . contact hole, 55 . . . contact hole, 56 . . . contact hole, 58 . . . contact hole, 60 . . . barrier metal layer, 61 . . . first barrier metal portion, 62 . . . second barrier metal portion, 63 . . . first alloy layer, 64 . . . plug layer, 65 . . . trench contact portion, 66 . . . oxide layer, 67 . . . metal film, 68 . . . covering layer, 70 . . . transistor portion, 71 . . . mesa portion, 80 . . . diode portion, 81 . . . mesa portion, 82 . . . cathode region, 85 . . . extension region, 90 . . . boundary portion, 91 . . . mesa portion, 100 . . . semiconductor device, 102 . . . end side, 112 . . . gate pad, 114 . . . sensing electrode, 115 . . . current sensing portion, 116 . . . anode pad, 117 . . . anode wiring, 118 . . . cathode pad, 119 . . . cathode wiring, 120 . . . active portion, 130 . . . outer circumferential gate runner, 131 . . . inter-active-portion gate runner, 140 . . . edge termination structure portion, 151 . . . back surface side lifetime control region, 152 . . . front-surface-side lifetime control region, 161 . . . first conductivity-type region, 162 . . . second conductivity-type region, 165 . . . polycrystalline layer, 180 . . . temperature-sensing portion, 181 . . . cathode region, 182 . . . anode region, 184 . . . interlayer dielectric film, 186 . . . cathode electrode, 187. . . anode electrode.

What is claimed is:

1. A semiconductor device comprising:

a semiconductor substrate;

an interlayer dielectric film that has a contact hole and is provided above the semiconductor substrate;

a first alloy layer provided on an upper surface of the semiconductor substrate below the contact hole;

an oxide layer provided on an upper surface of the first alloy layer in the contact hole;

a barrier metal layer that is conductive and provided above the oxide layer in the contact hole; and a plug layer provided above the barrier metal layer in the contact hole.

2. The semiconductor device according to claim 1, wherein the oxide layer is provided in contact with the first alloy layer and the barrier metal layer.

3. The semiconductor device according to claim 1, wherein the first alloy layer and the barrier metal layer include a predetermined first metal, and the oxide layer includes the first metal.

4. The semiconductor device according to claim 1, comprising:

a drift region of a first conductivity type provided on the semiconductor substrate;

a first conductivity-type region of a first conductivity type that is provided on a front surface of the semiconductor substrate and that has a higher doping concentration than the drift region; and a second conductivity-type region of a second conductivity type provided on the front surface of the semiconductor substrate, wherein a film thickness of the oxide layer is thinner above the second conductivity-type region than above the first conductivity-type region.

5. The semiconductor device according to claim 4, wherein the oxide layer is not provided above the second conductivity-type region.

6. The semiconductor device according to claim 1, comprising:

a polycrystalline layer provided above or in the semiconductor substrate; and a front-surface-side metal layer that is electrically connected to the polycrystalline layer through the contact hole provided above the polycrystalline layer.

7. The semiconductor device according to claim 1, wherein the barrier metal layer is provided on an upper surface of the oxide layer and on a side wall of the interlayer dielectric film in the contact hole.

8. The semiconductor device according to claim 7, wherein the barrier metal layer includes:

a first barrier metal portion that is conductive and provided on the side wall of the interlayer dielectric film; and a second barrier metal portion that is conductive and stacked on the first barrier metal portion in the contact hole, wherein the first barrier metal portion is denser than the second barrier metal portion.

9. The semiconductor device according to claim 8, wherein the second barrier metal portion is provided in contact with the first barrier metal portion and the oxide layer.

10. The semiconductor device according to claim 1, comprising:

a trench contact portion that includes the contact hole and is provided so as to extend from a front surface of the semiconductor substrate in a depth direction of the semiconductor substrate.

11. The semiconductor device according to claim 10, wherein the first alloy layer is provided in contact with a side wall of the semiconductor substrate and an upper surface of the semiconductor substrate in the trench contact portion, and the oxide layer is provided in contact with an upper surface and a side surface of the first alloy layer in the trench contact portion.

12. The semiconductor device according to claim 10, wherein the barrier metal layer is provided in contact with the oxide layer that is provided on a side wall of the semiconductor substrate.

13. The semiconductor device according to claim 1, comprising:

a transistor portion and a diode portion.

14. The semiconductor device according to claim 13, comprising:

a front-surface-side lifetime control region provided on a front surface side relative to a center of the semiconductor substrate in a depth direction of the semiconductor substrate.

15. The semiconductor device according to claim 14, wherein the front-surface-side lifetime control region is formed by irradiating the semiconductor substrate with a particle beam.

16. The semiconductor device according to claim 1, comprising:

a back-surface-side metal layer provided in contact with a back surface of the semiconductor substrate.

17. A manufacturing method of a semiconductor device, comprising:

forming an interlayer dielectric film that includes a contact hole above a semiconductor substrate;

forming a first alloy layer on an upper surface of the semiconductor substrate below the contact hole;

forming an oxide layer on an upper surface of the first alloy layer in the contact hole;

forming a barrier metal layer that is conductive above the oxide layer in the contact hole; and forming a plug layer above the barrier metal layer in the contact hole.

18. The manufacturing method of the semiconductor device according to claim 17, wherein the forming the oxide layer includes wet etching the upper surface of the first alloy layer after forming the first alloy layer on the upper surface of the semiconductor substrate.

19. The manufacturing method of the semiconductor device according to claim 18, wherein the wet etching the upper surface of the first alloy layer includes wet etching it using hydrogen peroxide or buffered hydrofluoric acid.

20. The manufacturing method of the semiconductor device according to claim 17, wherein the forming the oxide layer includes annealing the semiconductor substrate in an oxygen atmosphere.

* * * * *